(12) United States Patent
Kikuchi et al.

(10) Patent No.: US 9,240,417 B1
(45) Date of Patent: Jan. 19, 2016

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventors: Kenrou Kikuchi, Yokkaichi (JP); Koichi Matsuno, Mie (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/630,079

(22) Filed: Feb. 24, 2015

Related U.S. Application Data

(60) Provisional application No. 62/042,307, filed on Aug. 27, 2014.

(51) Int. Cl.
*H01L 27/115* (2006.01)
*H01L 27/108* (2006.01)

(52) U.S. Cl.
CPC ..... *H01L 27/11568* (2013.01); *H01L 27/10805* (2013.01); *H01L 27/11524* (2013.01); *H01L 27/11529* (2013.01)

(58) Field of Classification Search
CPC ............ H01L 27/0629; H01L 27/0727; H01L 27/0733
See application file for complete search history.

(56) References Cited

U.S. PATENT DOCUMENTS

| | | | | |
|---|---|---|---|---|
| 6,433,398 | B1* | 8/2002 | Suzuki | H01L 27/0629 257/300 |
| 8,471,319 | B2 | 6/2013 | Matsuo et al. | |
| 8,471,326 | B2 | 6/2013 | Nakahara et al. | |
| 8,791,517 | B2* | 7/2014 | Kutsukake | H01L 27/11521 257/299 |
| 2002/0130342 | A1* | 9/2002 | Suzuki | H01L 27/0629 257/296 |
| 2007/0267685 | A1* | 11/2007 | Ishibashi | H01L 27/0738 257/316 |
| 2008/0283896 | A1* | 11/2008 | Noguchi | H01L 27/105 257/315 |
| 2013/0175592 | A1 | 7/2013 | Takekida | |

* cited by examiner

*Primary Examiner* — Matthew W Such
*Assistant Examiner* — Ali Naraghi
(74) *Attorney, Agent, or Firm* — Oblon, McClelland, Maier & Neustadt, L.L.P.

(57) ABSTRACT

According to an embodiment, a nonvolatile semiconductor memory device comprises a memory area, a capacitor area, and a transistor area, on a semiconductor substrate. The nonvolatile semiconductor memory device comprises a memory cell and a select gate transistor, in the memory area. The nonvolatile semiconductor memory device includes a capacitor comprising a first electrode layer and a second electrode layer stacked on the first electrode layer via an insulating layer. An upper surface of the capacitor is covered by a first insulating layer, and the insulating layer has an upper level portion and a lower level portion. A part of an outline of the upper level portion is along a part of an outline of the second electrode layer.

6 Claims, 30 Drawing Sheets

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/042,307, filed on Aug. 27, 2014, the entire contents of which are incorporated herein by reference.

BACKGROUND

1. Field

Embodiments described here relate to a nonvolatile semiconductor memory device and a method of manufacturing the same.

2. Description of the Related Art

A memory cell configuring a nonvolatile semiconductor memory device such as a NAND type flash memory includes a semiconductor layer, a control gate electrode, and a charge accumulation layer. The memory cell changes its threshold voltage according to a charge accumulated in the charge accumulation layer to store a magnitude of this threshold voltage as data. In recent years, enlargement of capacity and raising of integration level has been proceeding in such a nonvolatile semiconductor memory device.

DETAILED DESCRIPTION

A nonvolatile semiconductor memory device according to an embodiment described below comprises a memory area, a capacitor area, and a transistor area, on a semiconductor substrate. Moreover, the nonvolatile semiconductor memory device comprises a memory cell and a select gate transistor, in the memory area. The memory cell comprises the semiconductor substrate, a charge accumulation layer, and a first control gate layer. The select gate transistor comprises the semiconductor substrate and a second control gate layer. Moreover, the nonvolatile semiconductor memory device includes a capacitor comprising a first electrode layer, an inter-electrode insulating layer stacked on the first electrode layer, a second electrode layer and a third electrode layer stacked on the inter-electrode insulating layer, in the capacitor area. The second electrode layer and the third electrode layer are distanced from each other in a certain direction parallel to the semiconductor substrate. Moreover, the nonvolatile semiconductor memory device includes a control transistor comprising the semiconductor substrate and a third control gate layer, in the transistor area. In addition, at least an upper surface of the capacitor is covered by a first insulating film. The first insulating layer has an upper level portion and a lower level portion. A part of an outline of the upper level portion is along a part of an outline of at least one of the second electrode layer and the third electrode layer in a direction perpendicular to the semiconductor substrate. The lower level portion is nearer the semiconductor substrate than the upper level portion.

First Embodiment

[Overall Configuration]

Figure 1:
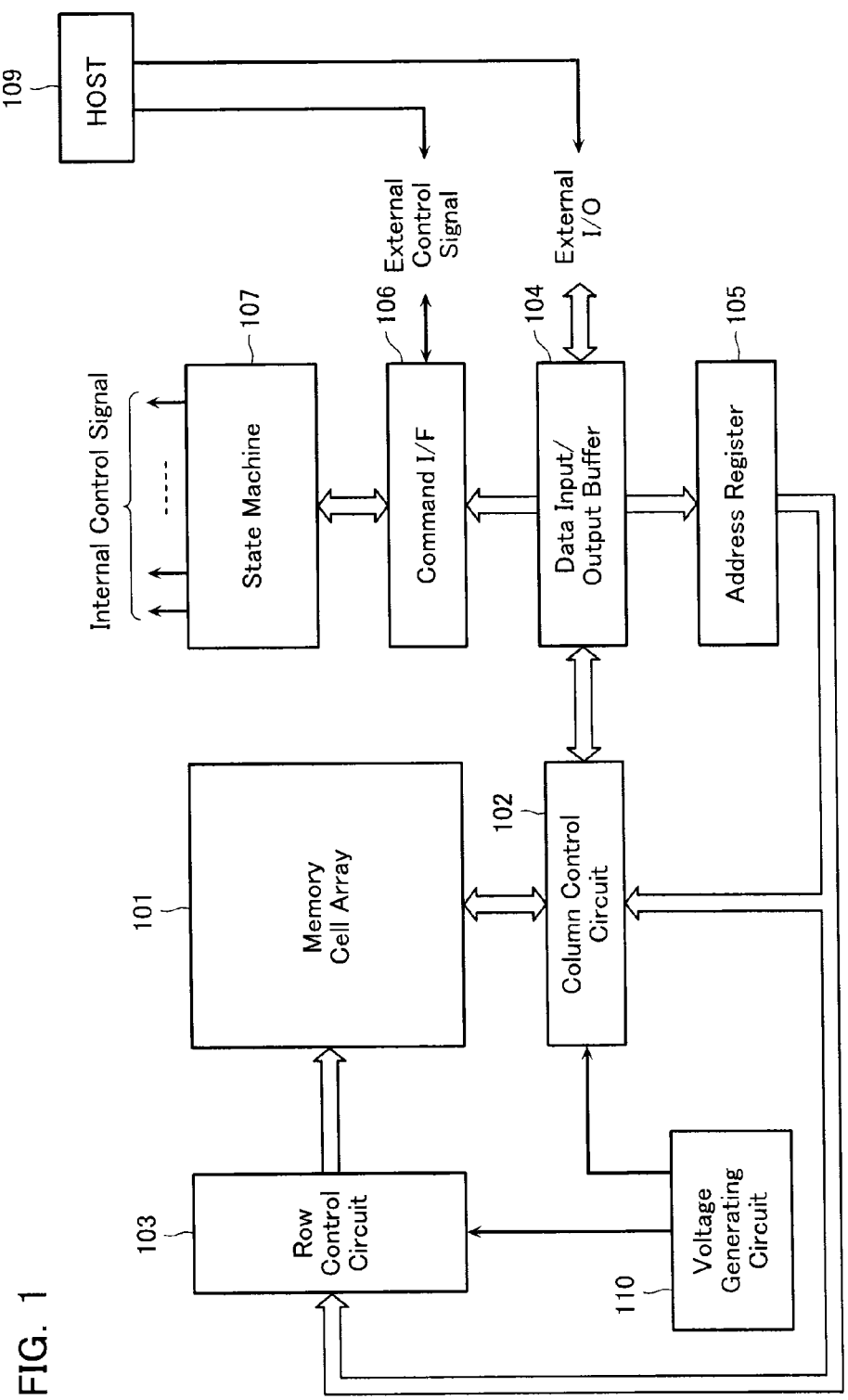
FIG. 1 is a block diagram showing a schematic configuration of a nonvolatile semiconductor memory device according to a first embodiment.

FIG. 1 is a block diagram of a nonvolatile semiconductor memory device according to a first embodiment. This nonvolatile semiconductor memory device includes a memory cell array 101 having a plurality of memory cells MC disposed substantially in a matrix therein, and comprising a bit line BL and a word line WL disposed orthogonally to each other and connected to these memory cells MC. Provided in a periphery of this memory cell array 101 are a column control circuit 102 and a row control circuit 103. The column control circuit 102 controls the bit line BL and performs data erase of the memory cell, data write to the memory cell, and data read from the memory cell. The row control circuit 103 selects the word line WL and applies a voltage for data erase of the memory cell, data write to the memory cell, and data read from the memory cell.

A data input/output buffer 104 is connected to an external host 109, via an I/O line, and receives write data, receives an erase command, outputs read data, and receives address data or command data. The data input/output buffer 104 sends received write data to the column control circuit 102, and receives data read from the column control circuit 102 to be outputted to external. An address supplied to the data input/output buffer 104 from external is sent to the column control circuit 102 and the row control circuit 103 via an address register 105.

Moreover, a command supplied to the data input/output buffer 104 from the host 109 is sent to a command interface 106. The command interface 106 receives an external control signal from the host 109, determines whether data inputted to the data input/output buffer 104 is write data or a command or an address, and, if a command, receives the data and transfers the data to a state machine 107 as a command signal.

The state machine 107 performs management of this nonvolatile memory overall, receives a command from the host 109, via the command interface 106, and performs management of read, write, erase, input/output of data, and so on.

In addition, it is also possible for the external host 109 to receive status information managed by the state machine 107 and judge an operation result. Moreover, this status information is utilized also in control of write and erase.

Furthermore, the state machine 107 controls a voltage generating circuit 110. This control enables the voltage generating circuit 110 to output a pulse of any voltage and any timing.

Now, the pulse formed by the voltage generating circuit 110 can be transferred to any line selected by the column control circuit 102 and the row control circuit 103. These column control circuit 102, row control circuit 103, state machine 107, voltage generating circuit 110, and so on, configure a control circuit in the present embodiment.

[Memory Cell Array 101]

Figure 2:
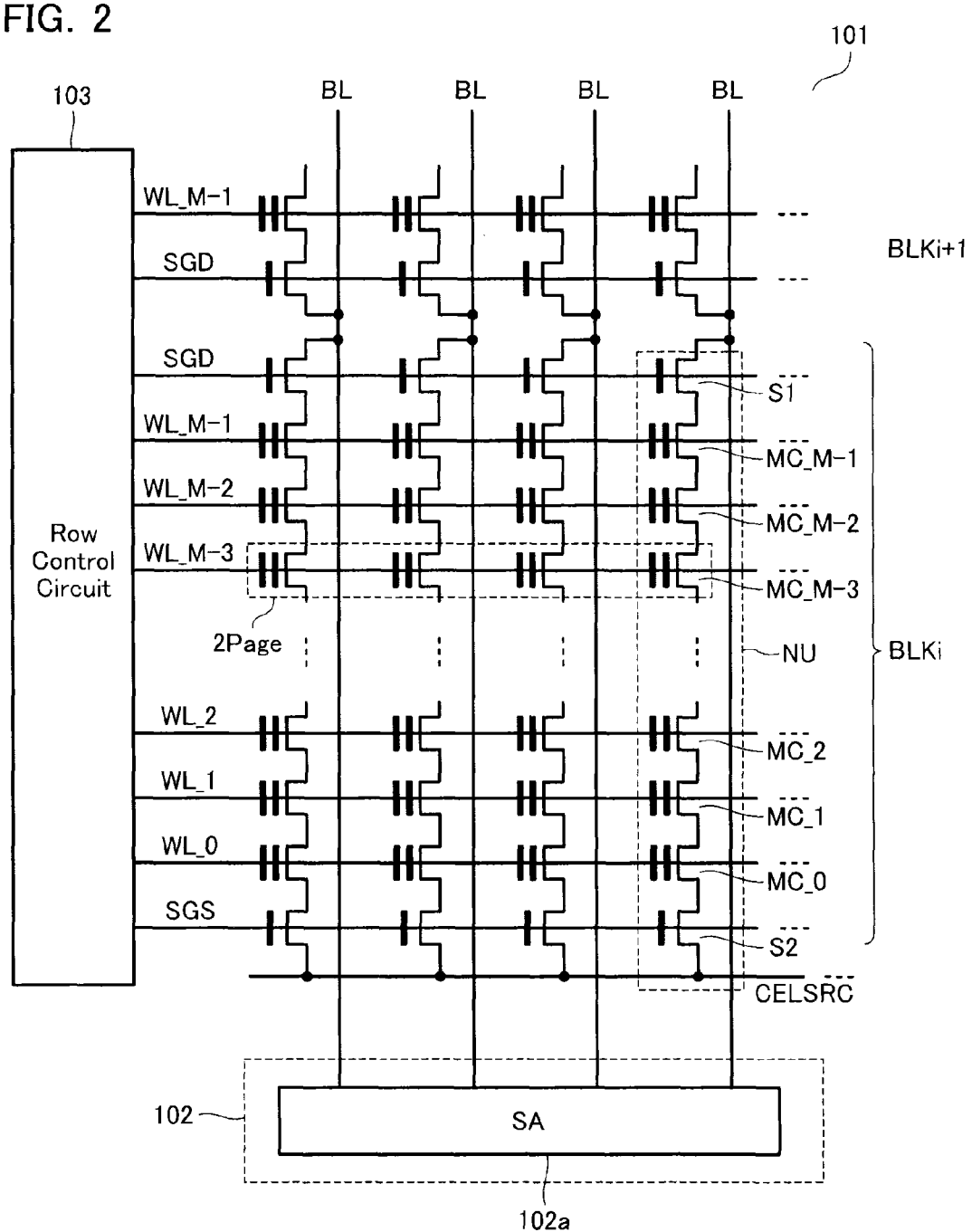
FIG. 2 is a circuit diagram showing a configuration of part of the same nonvolatile semiconductor memory device.

FIG. 2 is a circuit diagram showing a configuration of the memory cell array 101. As shown in FIG. 2, the memory cell array 101 is configured having NAND cell units NU arranged therein, each of the NAND cell units NU being configured having select gate transistors S1 and S2 respectively connected to both ends of a NAND string, the NAND string having M electrically rewritable nonvolatile memory cells MC_0 to MC_M−1 connected in series therein, sharing a source and a drain.

The NAND cell unit NU has one end (a select gate transistor S1 side) connected to the bit line BL and the other end (a select gate transistor S2 side) connected to a common source line CELSRC. Gate electrodes of the select gate transistors S1 and S2 are connected to select gate lines SGD and SGS. In addition, control gate electrodes of the memory cells MC_0 to MC_M−1 are respectively connected to word lines WL_0 to WL_M−1. The bit line BL is connected to a sense amplifier 102a of the column control circuit 102, and the word lines WL_0 to WL_M−1 and select gate lines SGD and SGS are connected to the row control circuit 103.

In the case of 2 bits/cell where 2 bits of data are stored in one memory cell MC, data stored in the plurality of memory cells MC connected to one word line WL configures 2 pages (an upper page UPPER and a lower page LOWER) of data.

One block ELK is formed by the plurality of NAND cell units NU sharing the word line WL. One block BLK forms a single unit of a data erase operation. The number of word lines WL in one block BLK in one memory cell array 101 is M, and, in the case of 2 bits/cell, the number of pages in one block is M×2 pages.

[Stacked Structure]

Figure 3:
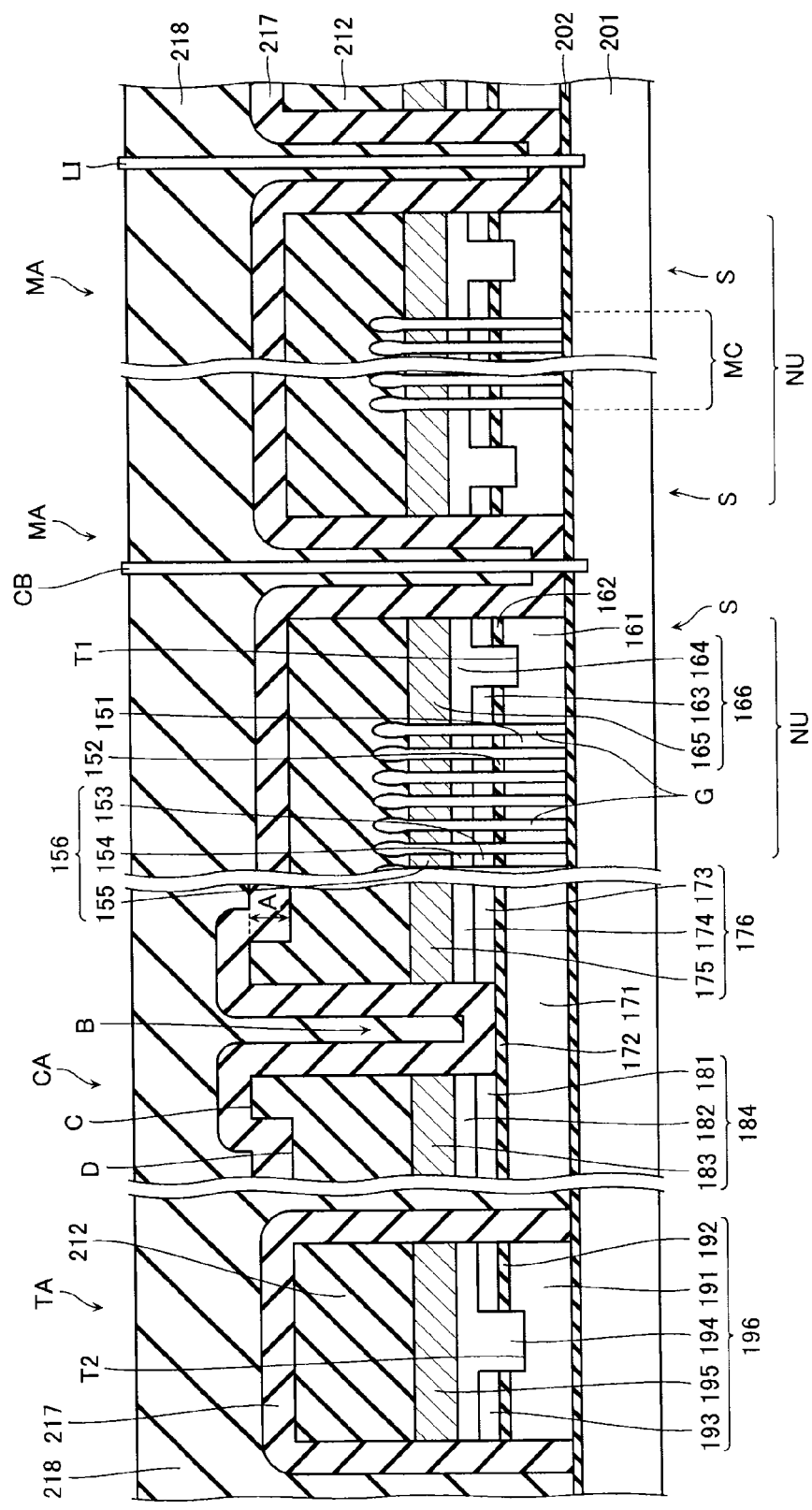
FIG. 3 is a schematic cross-sectional view showing a configuration of part of the same nonvolatile semiconductor memory device.
Figure 4:
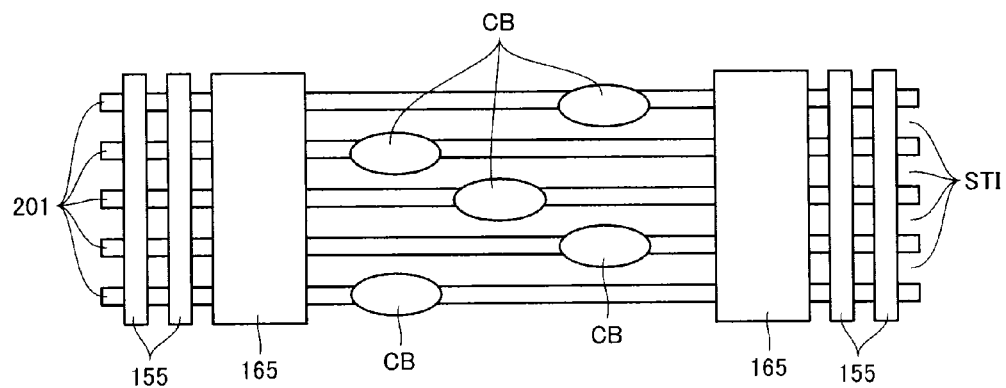
FIG. 4 is a schematic plan view showing a configuration of part of the same nonvolatile semiconductor memory device.
Figure 5:
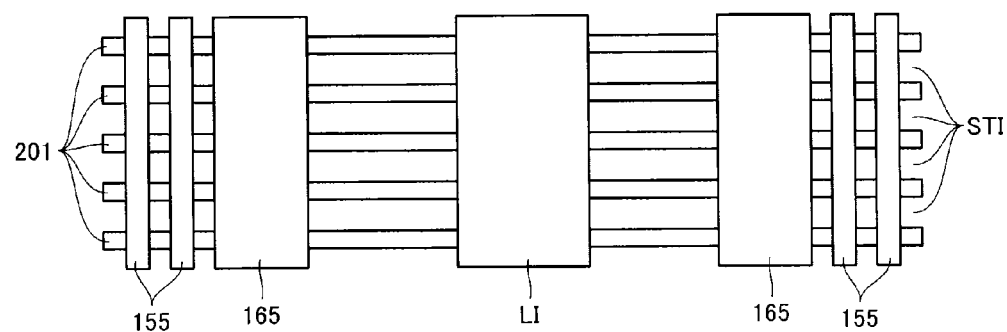
FIG. 5 is a schematic plan view showing a configuration of part of the same nonvolatile semiconductor memory device.

FIG. 3 is a schematic cross-sectional view showing a stacked structure of part of the nonvolatile semiconductor memory device according to the first embodiment. FIGS. 4 and 5 are schematic plan views each showing a stacked structure of part of the same nonvolatile semiconductor memory device.

As shown in FIG. 3, the nonvolatile semiconductor memory device according to the present embodiment comprises a memory area MA where the memory cell is formed, a capacitor area CA where a capacitor is formed, and a transistor area TA where a control transistor is formed, on a semiconductor substrate 201. The capacitor and the control transistor configure the control circuit of the kind shown in FIG. 1. Note that for convenience of illustration, in FIG. 3, the memory area MA, the capacitor area CA, and the transistor area TA are disposed linearly, but nonvolatile semiconductor memory devices according to embodiments are not limited to this configuration, and each of the areas may be disposed in any position on the semiconductor substrate 201.

As shown in FIG. 3, provided in the memory area MA are the above-mentioned plurality of memory cells MC forming the NAND string, and select gate transistors S formed at ends of the NAND string and, together with the NAND string, configuring the NAND cell unit NU. An air gap G insulates between fellow memory cells MC and between the select gate transistors S. Moreover, a plurality of the NAND cell units NU are formed in a direction in which the memory cells MC are disposed. Therefore, two select gate transistors S are formed adjacently at ends of two adjacent NAND cell units NU. In addition, one end of the NAND cell unit NU is connected to the bit line BL (FIG. 2) via a drain contact CB.

Moreover, the other end of the NAND cell unit NU is connected to the source line CELSRC (FIG. 2) via a source contact LI. Furthermore, the drain contact CB and the source contact LI are shared between adjacent NAND cell units NU.

As shown in FIG. 3, the memory cell MC includes, stacked sequentially therein: the semiconductor substrate 201; a first gate insulating layer 202 functioning as a tunnel insulating film; a charge accumulation layer 151; a second gate insulating layer 152; and a control gate layer 156 functioning as the word line WL. Moreover, the control gate layer 156 includes, stacked sequentially therein: a first control gate semiconductor layer 153; a second control gate semiconductor layer 154; and a control gate metallic layer 155. The control gate layer 156 extends in a direction perpendicular to the plane of paper. Note that, for example, the charge accumulation layer 151, the first control gate semiconductor layer 153, and the second control gate semiconductor layer 154 are formed from polysilicon, and the control gate metallic layer 155 is configured from tungsten (W). Furthermore, for example, the second gate insulating layer 152 is formed from a high-dielectric film (ONO film) configured from three layers of silicon oxide ($SiO_2$), silicon nitride (SiN), and silicon oxide ($SiO_2$).

As shown in FIG. 3, the select gate transistor S includes, stacked sequentially therein: the semiconductor substrate 201; the first gate insulating layer 202 functioning as an insulating film; and a control gate layer 166 functioning as the select gate lines SGS and SGD. Moreover, the control gate layer 166 includes, stacked sequentially therein: a third control gate semiconductor layer 161; a control gate insulating layer 162; a fourth control gate semiconductor layer 163; a fifth control gate semiconductor layer 164; and a control gate metallic layer 165. Furthermore, a trench T1 is formed in the third control gate semiconductor layer 161, the control gate insulating layer 162, and the fourth control gate semiconductor layer 163. In addition, the fifth control gate semiconductor layer 164 is implanted in this trench and is electrically connected to the third control gate semiconductor layer 161. Moreover, in the memory area MA, an upper portion of a semiconductor substrate 201, the first gate insulating layer 202, the third control gate semiconductor layer 161, the control gate insulating layer 162, and the fourth control gate semiconductor layer 163 are formed in plurality in the direction perpendicular to the plane of paper. In addition, the fifth control gate semiconductor layer 164 and the control gate metallic layer 165 extend in the direction perpendicular to the plane of paper.

As shown in FIG. 3, upper surfaces of the plurality of memory cells MC and the select gate transistors S forming an identical NAND cell unit NU are covered by a hard mask 212. In the present embodiment, an upper surface of the hard mask 212 formed in the memory area MA is formed substantially flatly. In addition, a height of a hard mask 212 upper surface is comparable to a height of a later-mentioned lower level portion. Moreover, a hard mask 212 lower surface faces the gap G. Furthermore, the upper surface and a side surface of the hard mask 212 and a side surface of the select gate transistor S are covered by an ion implantation offset-dedicated spacer insulating layer 217.

As shown in FIGS. 4 and 5, in the memory area MA, the semiconductor substrate 201 is divided by a trench STI. Moreover, as shown in FIG. 4, the drain contact CB is respectively connected to each of the divided semiconductor substrates 201. Note that positions in a direction of extension of the semiconductor substrate 201 of the drain contacts CB connected to these semiconductor substrates 201 differ between adjacent semiconductor substrates 201. Moreover, as shown in FIG. 5, the source contact LI is commonly connected to each of a plurality of the semiconductor substrates 201.

As shown in FIG. 3, the capacitor formed in the capacitor area CA comprises: a first electrode layer 171 stacked on the first gate insulating layer 202; an inter-electrode insulating layer 172 stacked on the first electrode layer 171; and a second electrode layer 176 and a third electrode layer 184 stacked on the inter-electrode insulating layer 172. The second electrode layer 176 accumulates a charge in a surface facing the first electrode layer 171. Moreover, the third electrode layer 184 is connected to the first electrode layer 171 by a contact not illustrated, and functions as a lead-out wiring line.

As shown in FIG. 3, the second electrode layer 176 and the third electrode layer 184 have a substantially similar stacked structure and are divided in a certain direction by an electrode-dividing trench B. That is, the second electrode layer 176 includes, stacked sequentially therein: a first electrode semiconductor layer 173; a second electrode semiconductor layer 174; and a first electrode metallic layer 175. The third electrode layer 184 includes, stacked sequentially therein: a third electrode semiconductor layer 181; a fourth electrode semiconductor layer 182; and a second electrode metallic layer 183. Note that the third electrode layer 184 may also form an independent capacitor together with the first electrode layer 171.

As shown in FIG. 3, upper surfaces of the second electrode layer 176 and the third electrode layer 184 are covered by the hard mask 212. The hard mask 212 is divided in the certain direction by the electrode-dividing trench B, similarly to the second electrode layer 176 and the third electrode layer 184. In other words, hard masks 212 are positioned so that the hard masks 212 are distanced from each other in a certain direction parallel to the semiconductor substrate 201. Moreover, formed in an upper surface of the hard mask 212 are an upper level portion C formed along the electrode-dividing trench B, and a lower level portion D formed lower by an amount of a width A compared to this upper level portion C (a lower level portion D is positioned nearer the semiconductor substrate than the upper level portion C by an amount of a width A). In a direction perpendicular to the semiconductor substrate 201, at least a part of an outline of the upper level portion C is formed along a part of an outline of at least one of the second electrode layer 176 and the third electrode layer 184. In addition, the upper surface and side surfaces of the hard mask 212, side surfaces of the second electrode layer 176 and the third electrode layer 184, and an upper surface of the inter-electrode insulating layer 172 are covered by the spacer insulating layer 217. Note that at the upper surface of the hard mask 212, the spacer insulating layer 217 has a level difference in accordance with the upper level portion C and the lower level portion D.

As shown in FIG. 3, the control transistor formed in the transistor area TA includes, stacked sequentially therein: the semiconductor substrate 201; the first gate insulating layer 202 functioning as an insulating film; and a control gate layer 196. Moreover, the control gate layer 196 includes, stacked sequentially therein: a sixth control gate semiconductor layer 191; a control gate insulating layer 192; a seventh control gate semiconductor layer 193; an eighth control gate semiconductor layer 194; and a control gate metallic layer 195. In addition, a trench T2 is formed in the sixth control gate semiconductor layer 191, the control gate insulating layer 192, and the seventh control gate semiconductor layer 193. Moreover, the eighth control gate semiconductor layer 194 is implanted in this trench and is electrically connected to the sixth control gate semiconductor layer 191. In addition, an upper surface of the control gate layer 196 is covered by the hard mask 212. Moreover, in the present embodiment, an upper surface of the hard mask 212 formed in the transistor area TA is formed substantially flatly. In addition, in this embodiment, a height of the upper surface of the hard mask 212 is the same as a height of the lower level portion D of the level difference A. Moreover, the upper surface and side surfaces of the hard mask 212 and side surfaces of the control gate layer 196 are covered by the spacer insulating layer 217.

Furthermore, as shown in FIG. 3, each of the configurations in the memory area MA, the capacitor area CA, and the transistor area TA is covered by an insulating film 218.

As mentioned above, in the present embodiment, the upper surface of the hard mask 212 formed in the capacitor area CA is provided with the level difference A configured from the upper level portion C formed along the electrode-dividing trench and the lower level portion D formed lower compared to this upper level portion. As will be mentioned later, such a nonvolatile semiconductor memory device can be manufactured comparatively cheaply, suppressing manufacturing costs.

Moreover, in the present embodiment, the control gate layer 156 includes the control gate metallic layer 155 configured from a metal. Therefore, lowering of capacitive coupling ratio due to lack of depletion (coupling), or deterioration of write and erase characteristics accompanying this lowering of capacitive coupling ratio, and so on, occur less compared to when, for example, the control gate layer is formed from only a silicide of polysilicon, even when the memory cell MC has been finely processed to a certain degree or more. In addition, problems such as rise in word line resistance due to a thinning effect, or signal delay and write deficiency (a sufficient charge not being accumulated in the charge accumulation layer) accompanying this rise in word line resistance, and so on, occur less. Furthermore, there is no need to consider degree of difficulty of controlling an amount of silicide, either. Therefore, the nonvolatile semiconductor memory device according to the present embodiment can be suitably miniaturized.

Note that in the present embodiment, in the control gate layer 166 of the select gate transistor S formed in the memory area MA and the control gate layer 196 of the control transistor formed in the transistor area TA, the trench is implanted by a semiconductor layer. However, a metal electrode may be formed directly in the trench. Moreover, in the present embodiment, a plurality of the control gate layers 156 (word lines WL) are divided by the gap G, hence capacitive coupling between the word lines WL can be kept low. However, an insulator may be implanted between the control gate layers 156 (between the memory cells MC).

[Method of Manufacturing According to First Embodiment]

Next, a specific manufacturing process of a NAND type flash memory according to this embodiment will be described with reference to FIGS. 6 to 17. FIGS. 6 to 17 are cross-sectional views showing a method of manufacturing the nonvolatile semiconductor memory device according to the present embodiment.

Figure 6:
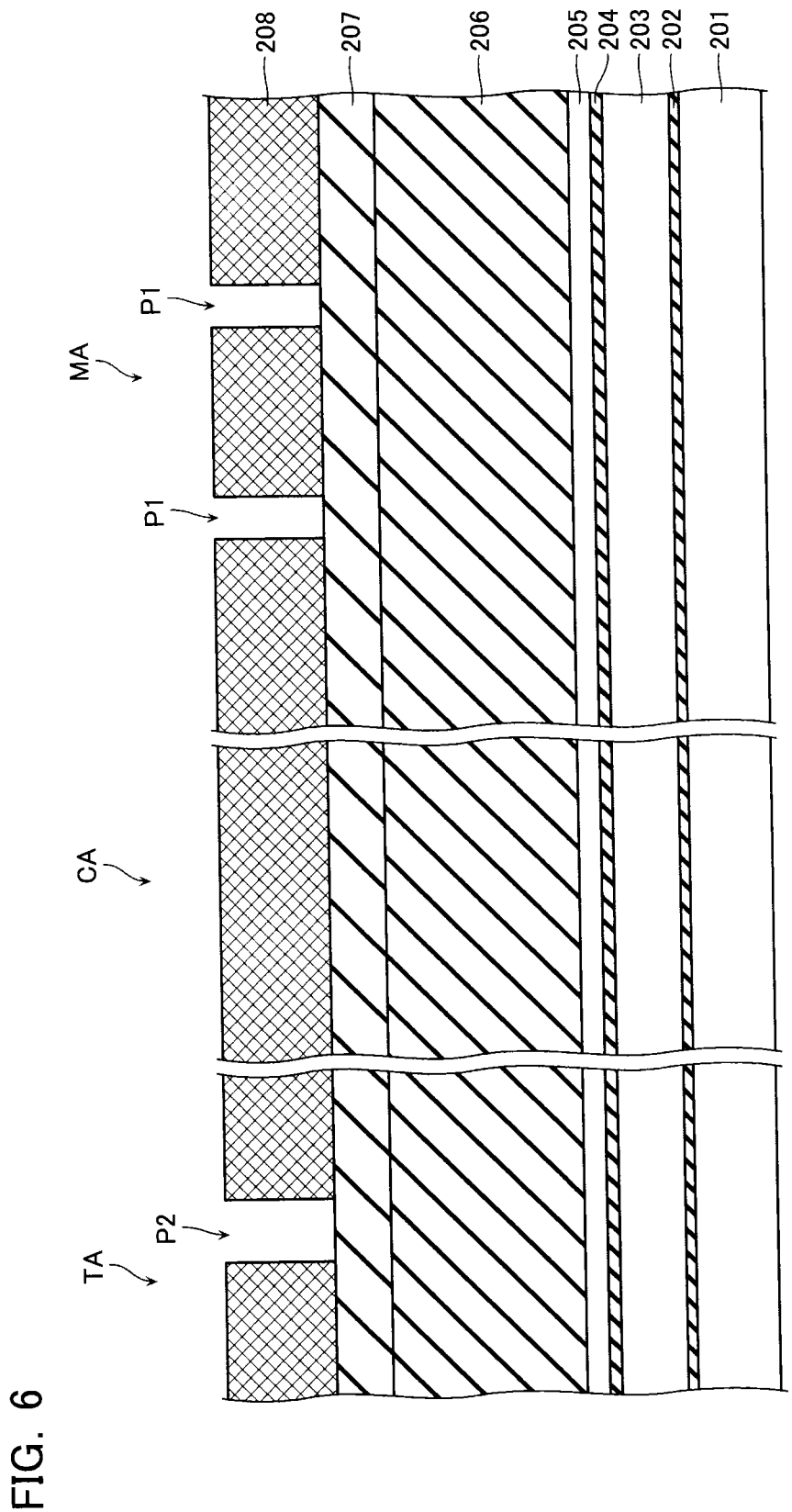
FIG. 6 is a cross-sectional view showing a manufacturing process of the same nonvolatile semiconductor memory device.

As shown in FIG. 6, the first gate insulating layer 202, a polysilicon layer (first conductive layer) 203, a second insulating layer 204, a polysilicon layer 205, a lower layer film resist 206, a SOG (Spin on Glass) layer 207, and a resist 208 are stacked sequentially on the semiconductor substrate 201. Following this, lithography is performed, and a portion P1 of the resist layer 208 where the select gate transistor S of the memory area MA is formed and a part P2 of the resist layer 208 in the transistor area TA are removed.

Figure 7:
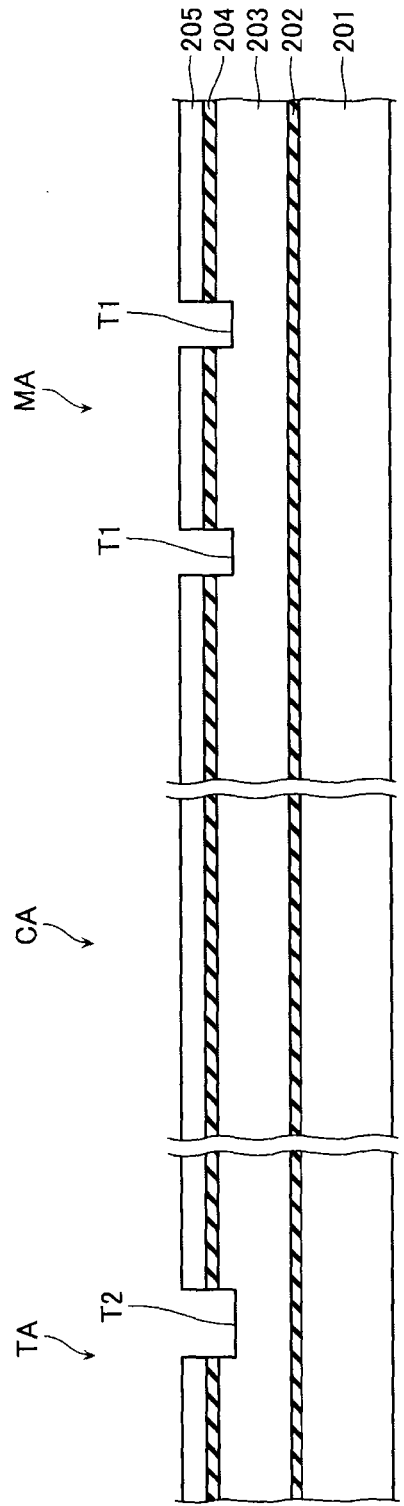
FIG. 7 is a cross-sectional view showing a manufacturing process of the same nonvolatile semiconductor memory device.

Next, as shown in FIG. 7, etching is performed using the resist layer 208 as a mask, and an upper portion of a polysilicon layer 203, the second insulating layer 204, and the polysilicon layer 205 at a portion of the memory area MA where the select gate transistor S is formed and in the transistor area TA are removed to form the trenches T1 and T2. Moreover, as shown in FIG. 7, the lower layer film resist 206, the SOG layer 207, and the resist 208 are removed. Note that after this process, an upper portion of a semiconductor substrate 201, the first gate insulating layer 202, the polysilicon layer 203, the second insulating layer 204, and the polysilicon layer 205 in the memory area MA may be divided in the direction perpendicular to the plane of paper.

Figure 8:
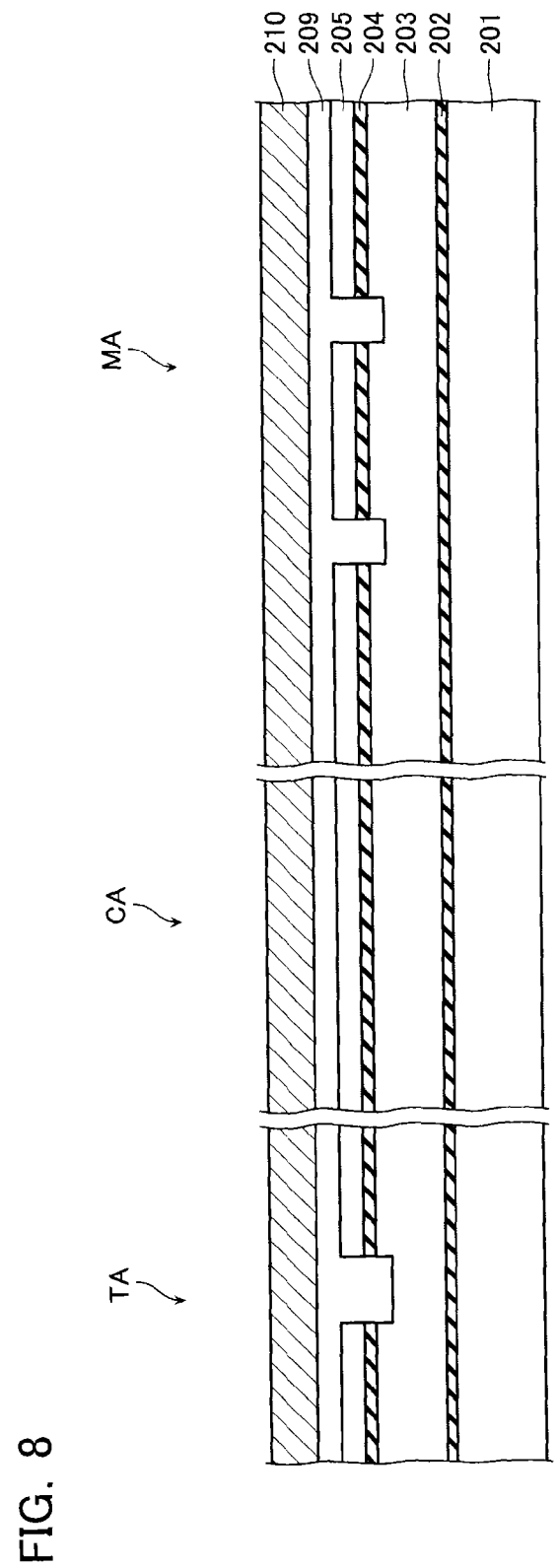
FIG. 8 is a cross-sectional view showing a manufacturing process of the same nonvolatile semiconductor memory device.

Next, as shown in FIG. 8, a polysilicon layer 209 and a metallic layer 210 are stacked on the polysilicon layer 205. At this time, the polysilicon layer 209 is implanted in the trenches T1 and T2.

Figure 9:
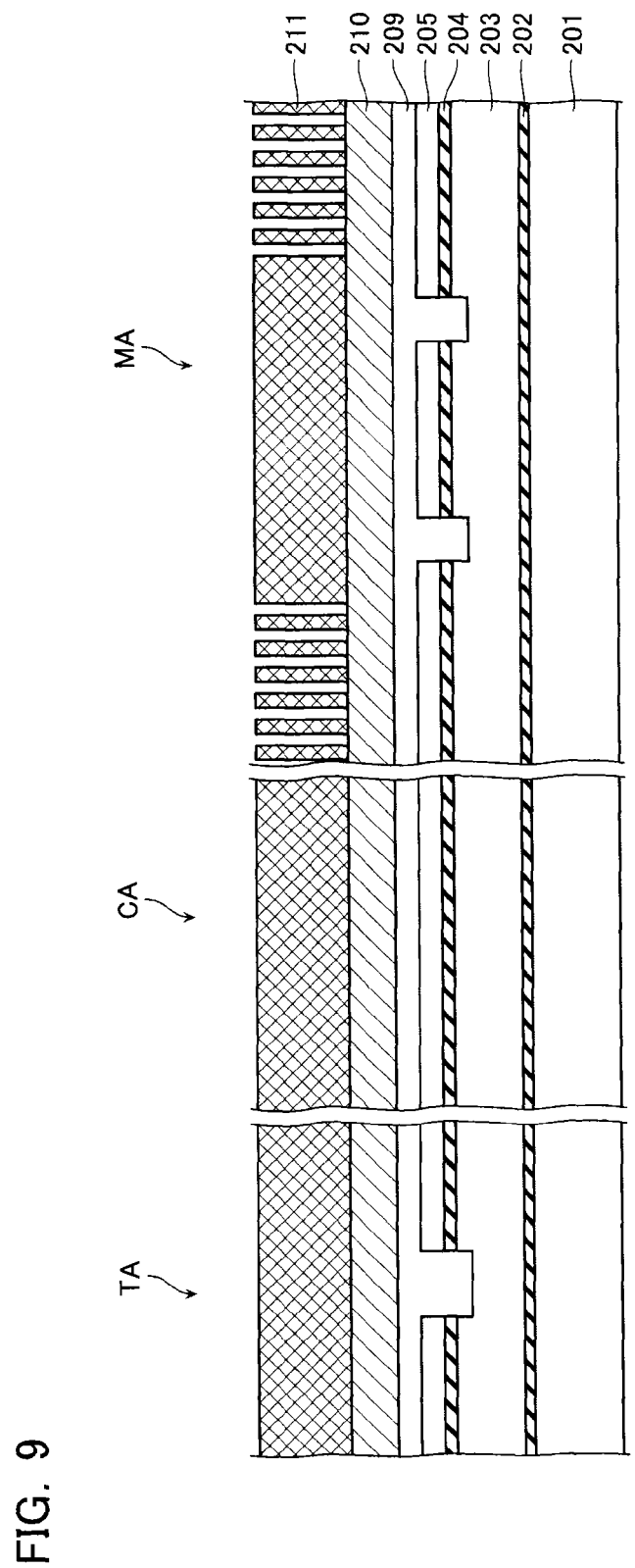
FIG. 9 is a cross-sectional view showing a manufacturing process of the same nonvolatile semiconductor memory device.

Next, as shown in FIG. 9, a resist layer 211 is stacked on the metallic layer 210. Following this, lithography is performed, and the resist layer 211 of a portion between adjacent memory cells MC and a portion between the memory cell MC and the select gate transistor S, is removed.

Figure 10:
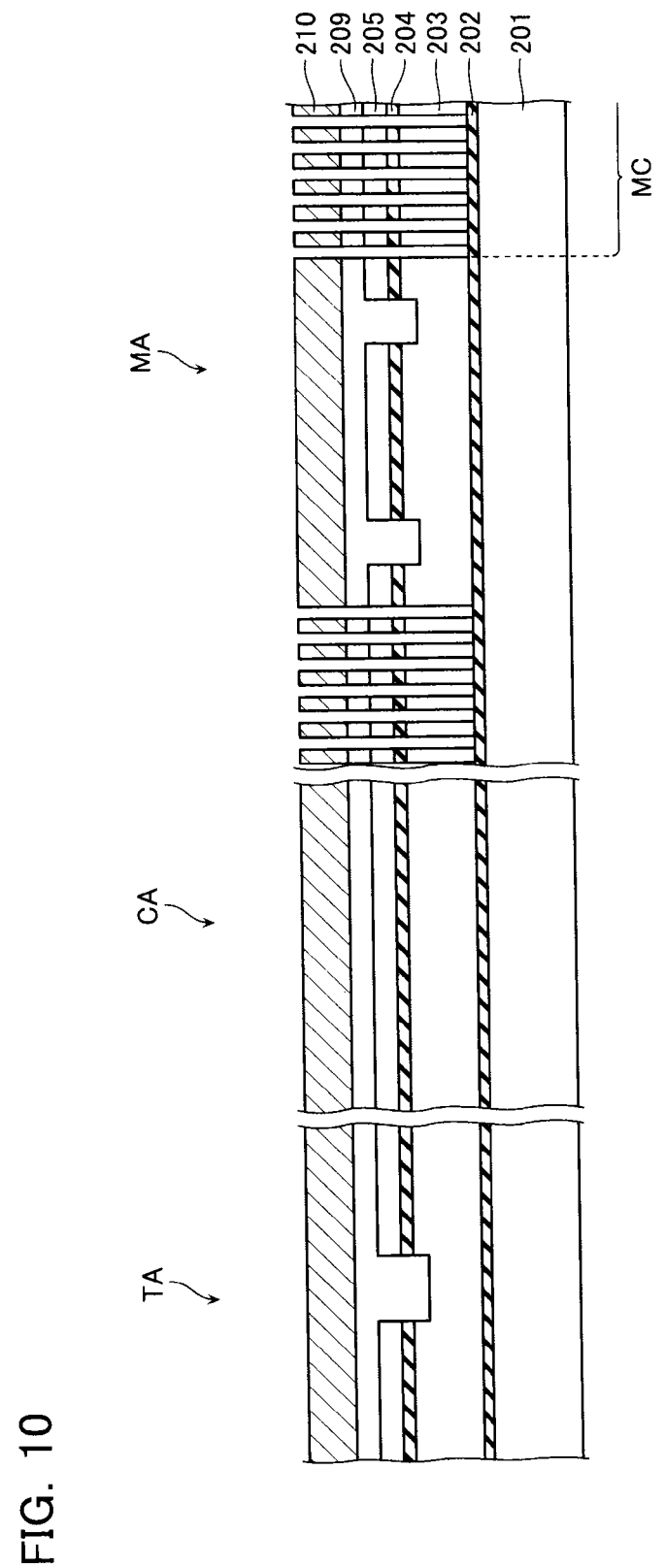
FIG. 10 is a cross-sectional view showing a manufacturing process of the same nonvolatile semiconductor memory device.

Next, as shown in FIG. 10, etching is performed using the resist layer 211 as a mask, and the polysilicon layer 203, the second insulating layer 204, the polysilicon layer 205, the polysilicon layer 209, and the metallic layer 210 of the portion between adjacent memory cells MC and the portion between the memory cell MC and the select gate transistor S, are removed and these layers divided to form the plurality of memory cells MC. Then, the resist layer 211 is removed.

In an example shown in FIG. 9 and FIG. 10, the resist layer 211 is used as a mask. Therefore, the pitch of the memory cells MC and the pitch of the divided resist layer 211 are the same. In contrast, it is possible to form a hard mask layer on the side surface of the divided resist layer 211, to remove the resist layer 211 and to perform etching using the hard mask as a mask. In this case, the pitch of memory cells MC is formed smaller than the pitch of the resist layer 211. Moreover, it is possible to form another hard mask (second hard mask) on the side surface of the hard mask (first hard mask) after the resist layer 211 is removed, to remove the first hard mask and to perform the etching using the second hard mask as a mask.

Figure 11:
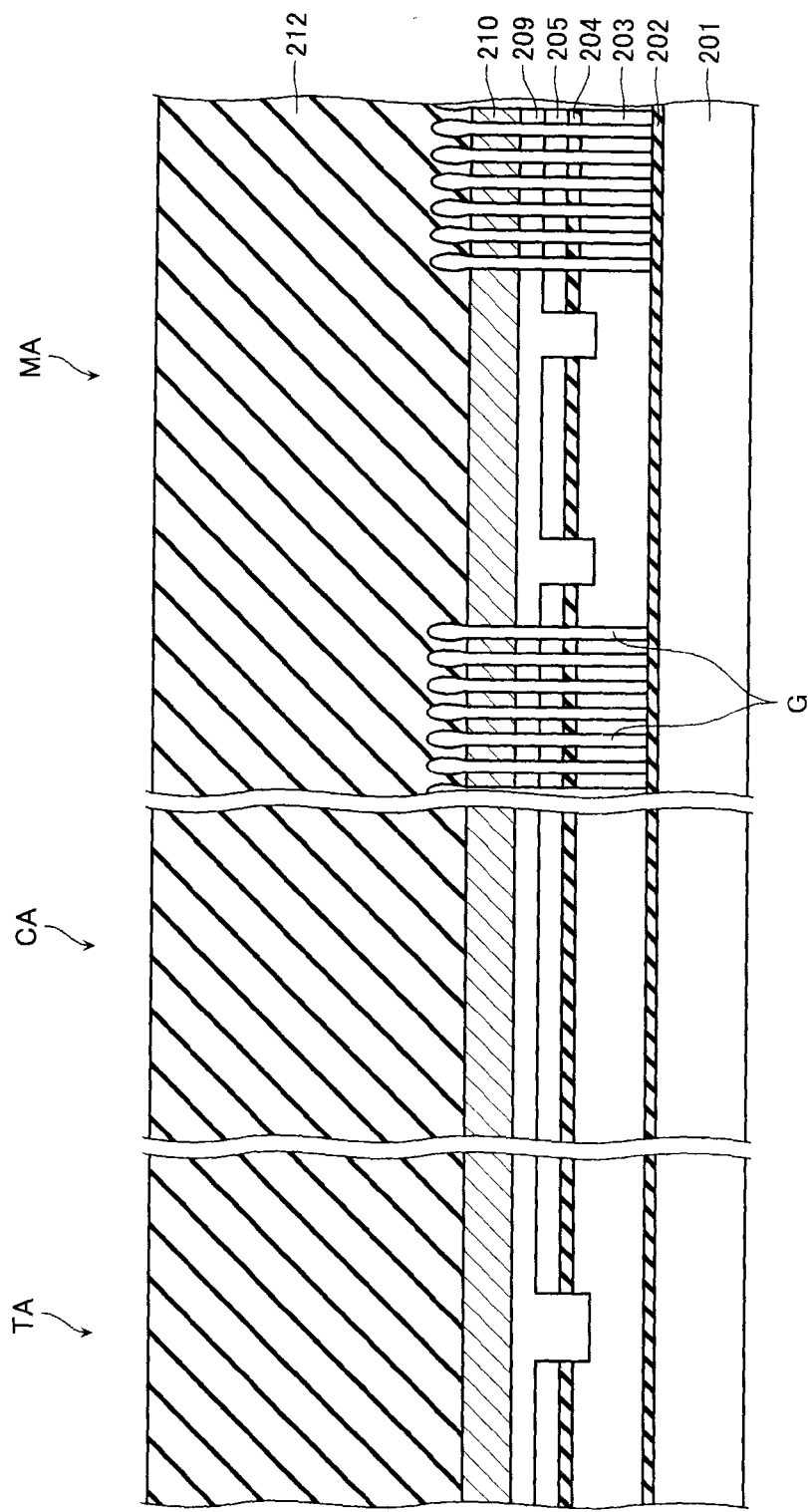
FIG. 11 is a cross-sectional view showing a manufacturing process of the same nonvolatile semiconductor memory device.

Next, as shown in FIG. 11, the hard mask 212 is formed on the metallic layer 210. The hard mask 212 may be formed by, for example, a material of poor implanting characteristics such as plasma silane (P—SiH$_4$), or the like. Therefore, the hard mask 212 is not implanted to the portion removed in the process shown in FIG. 10, that is, the portion between adjacent memory cells MC and the portion between the memory cell MC and the select gate transistor S, and as a result, the gap G is formed.

Figure 12:
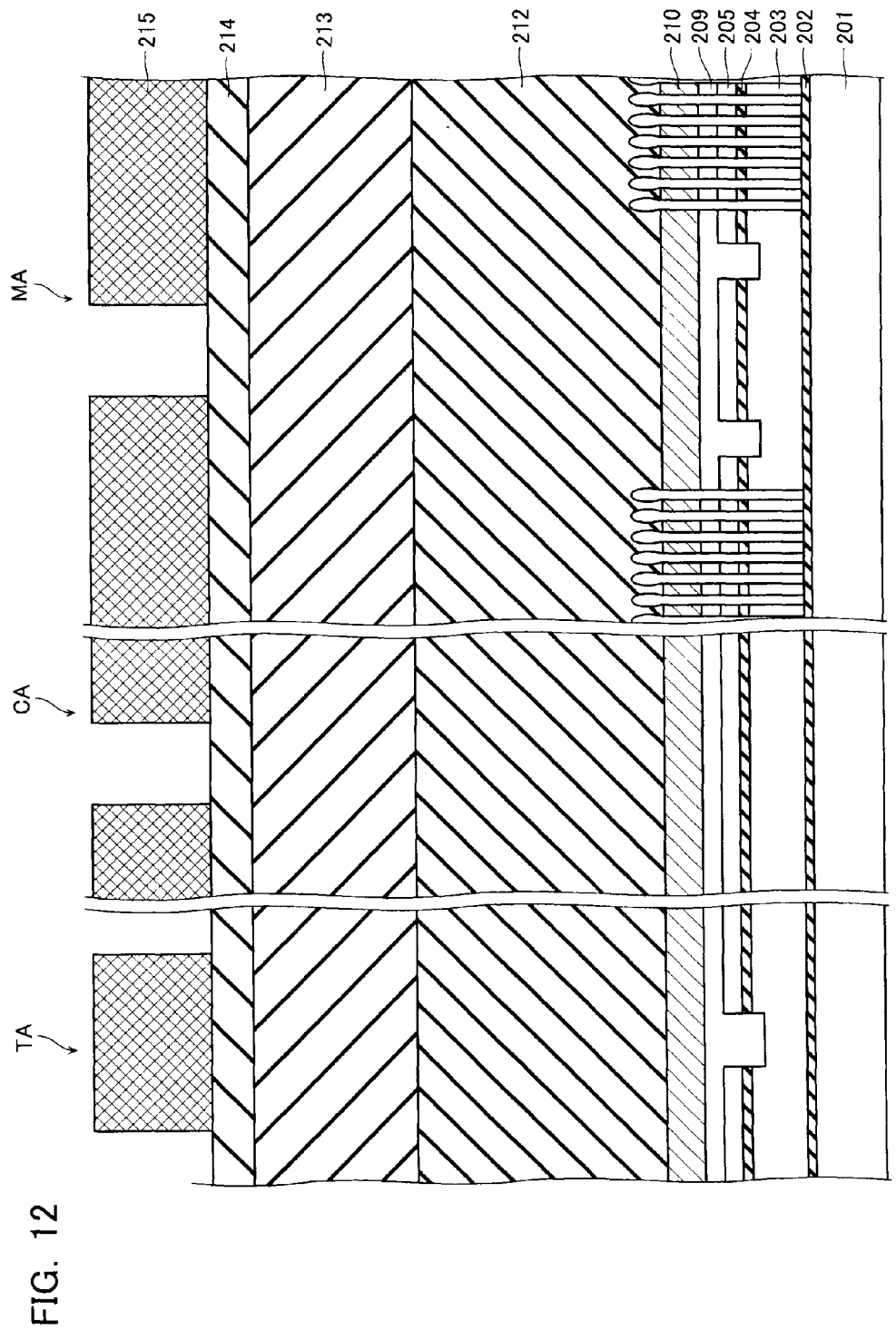
FIG. 12 is a cross-sectional view showing a manufacturing process of the same nonvolatile semiconductor memory device.

Next, as shown in FIG. 12, a lower layer film resist 213, a SOG layer 214, and a resist 215 are stacked on the hard mask 212. Following this, lithography is performed, and the resist 215 in a position dividing between the NAND cell units NU of the memory area MA, a position dividing the second electrode layer 176 from the third electrode layer 184 of the capacitor area CA, and a position dividing the control transistor from another layer of the transistor area TA, is removed.

Figure 13:
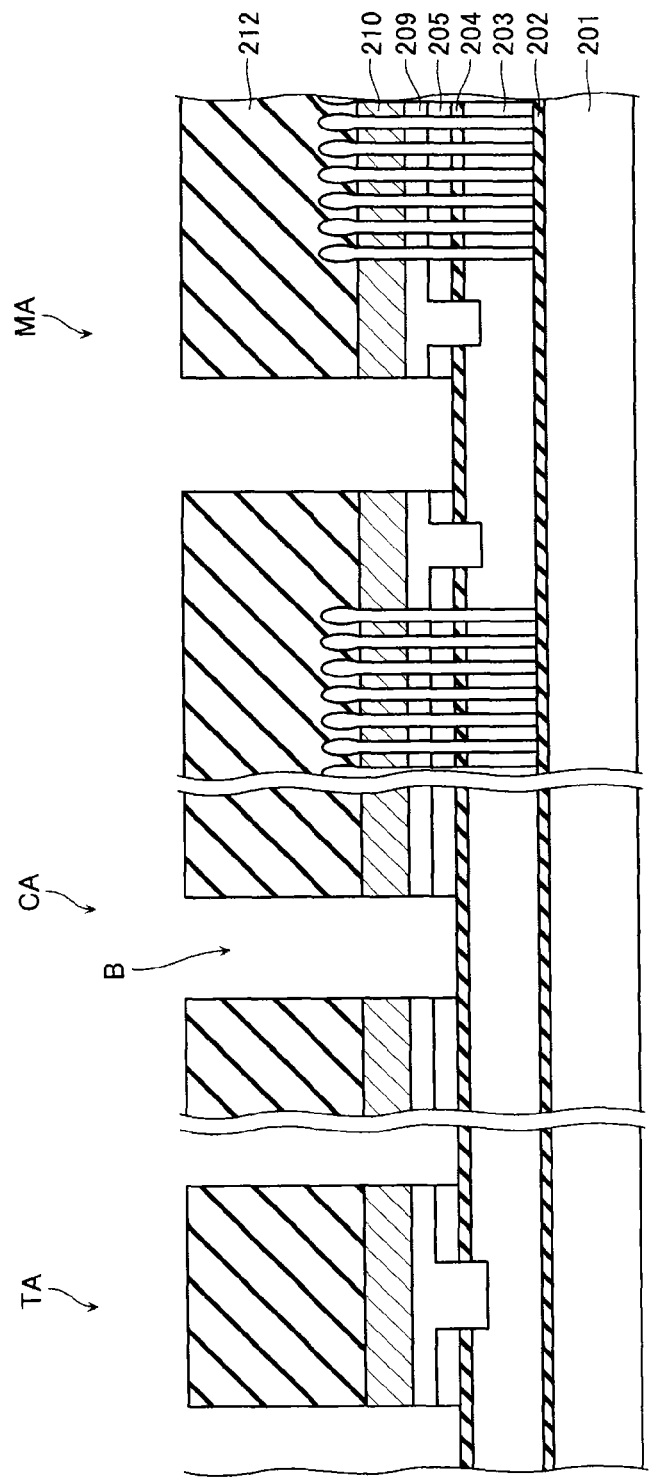
FIG. 13 is a cross-sectional view showing a manufacturing process of the same nonvolatile semiconductor memory device.

Next, as shown in FIG. 13, etching is performed using the resist 215 as a mask, and the polysilicon layer 205, the polysilicon layer 209, the metallic layer 210, and the hard mask 212 in the position dividing between the NAND cell units NU of the memory area MA, the position dividing the second electrode layer 176 from the third electrode layer 184 of the capacitor area CA, and the position dividing the control transistor from another layer of the transistor area TA, are removed. In this process, the electrode-dividing trench B dividing the second electrode layer 176 from the third electrode layer 184 is formed, whereby the capacitor is formed in the capacitor area CA. Following this, the lower layer film resist 213, the SOG layer 214, and the resist 215 are removed.

Figure 14:
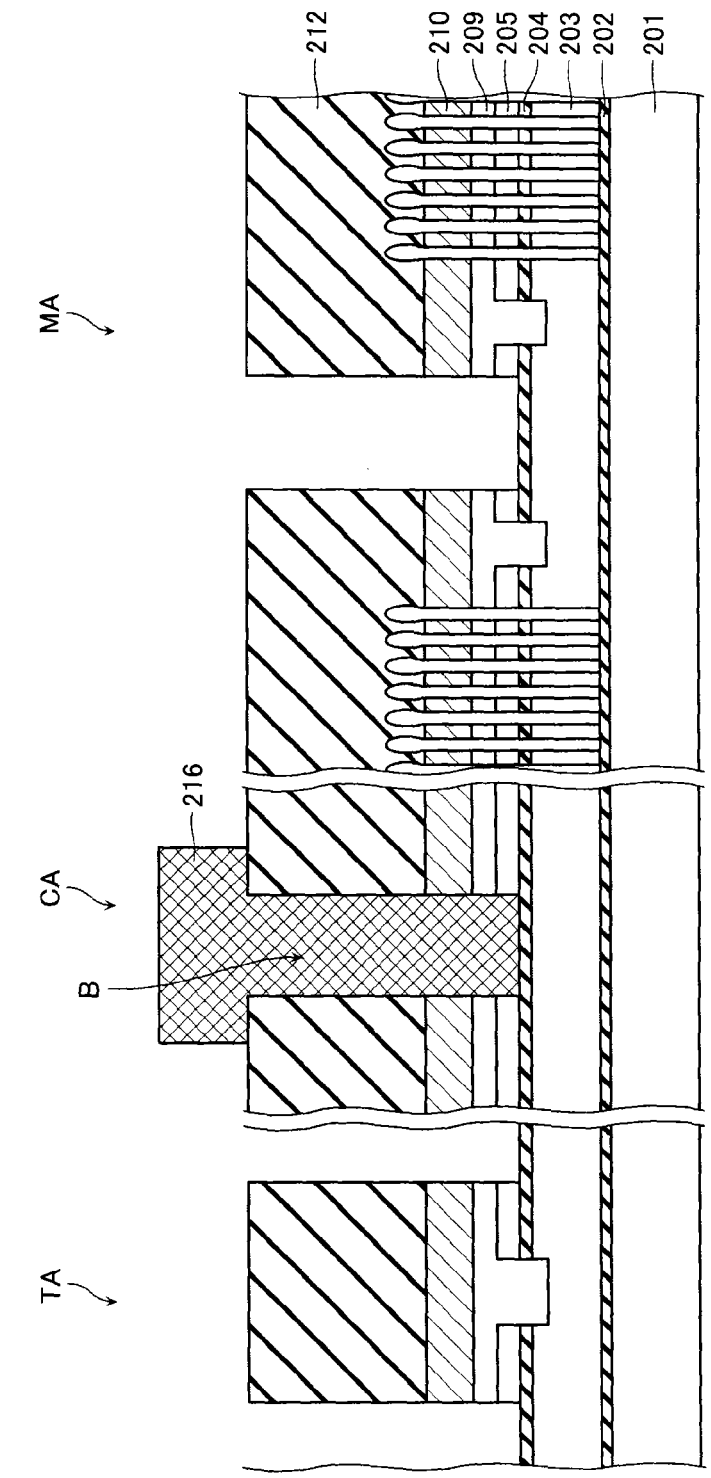
FIG. 14 is a cross-sectional view showing a manufacturing process of the same nonvolatile semiconductor memory device.

Next, as shown in FIG. 14, the electrode-dividing trench B and a periphery of the electrode-dividing trench B are covered by a resist 216, and the polysilicon layer 203 and the second insulating layer 204 in this portion are protected.

Figure 15:
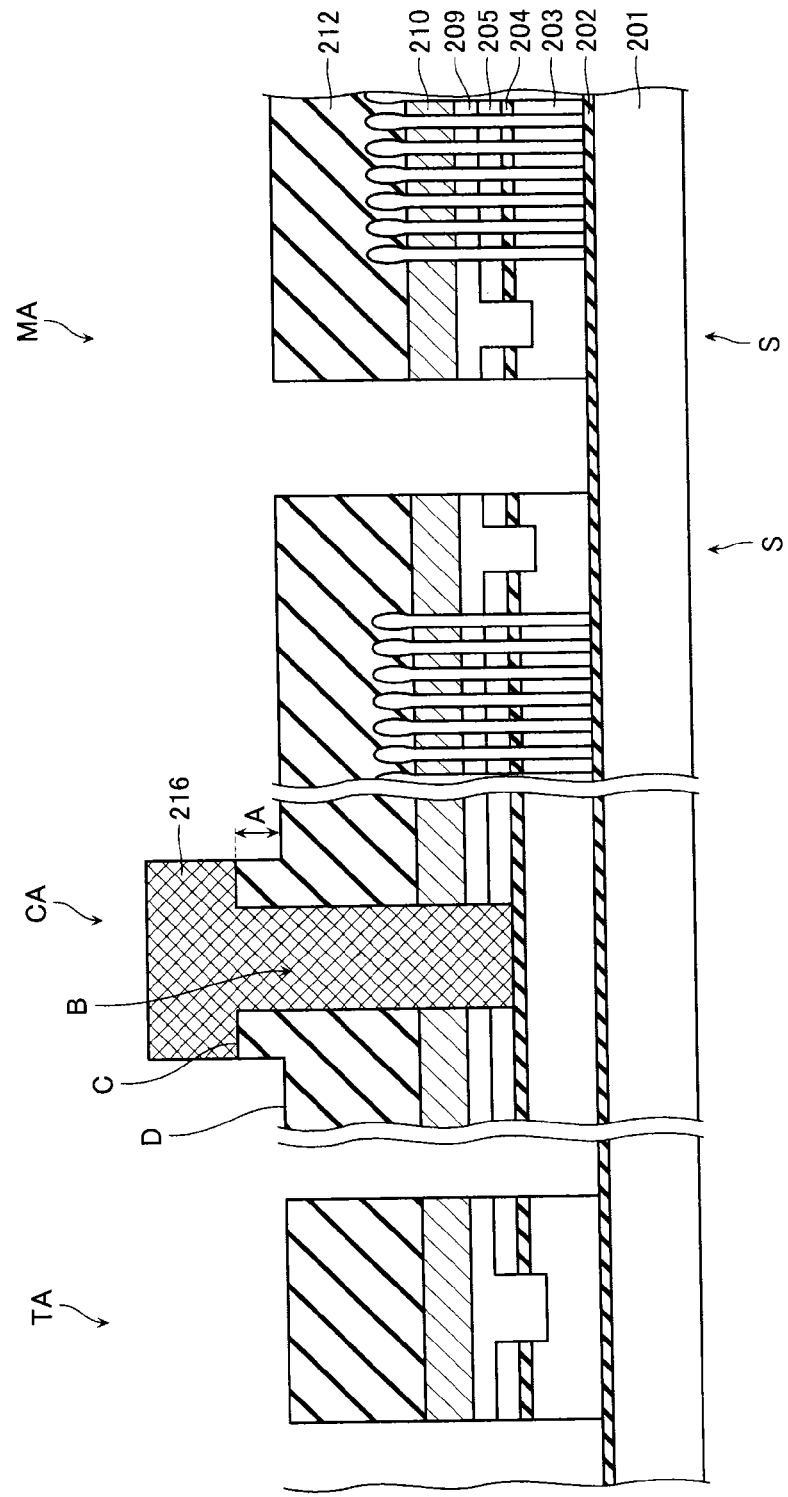
FIG. 15 is a cross-sectional view showing a manufacturing process of the same nonvolatile semiconductor memory device.

Next, as shown in FIG. 15, etching is performed using the resist 216 as a mask, and the polysilicon layer 203 and the second insulating layer 204 in the position dividing between the NAND cell units NU of the memory area. MA and the position dividing the control transistor from another layer of the transistor area TA, are removed. In this process, the select gate transistor S and the control transistor are formed. Moreover, in this process, the upper layer portion C is formed at a portion where the resist 216 is positioned and the lower layer portion D is formed at a portion where the resist 216 is not positioned. In the present embodiment, the upper layer portion C is formed along the electrode-dividing trench B. Moreover, the lower layer portion D is formed lower by the amount of the width A compared to the upper layer portion C. Moreover, in the present embodiment, the hard mask 212 upper surface is not protected either in the transistor area TA or in the memory area MA. Therefore, the hard mask 212 upper surface is formed substantially flatly and its height is comparable to the height of the lower layer portion D.

Figure 16:
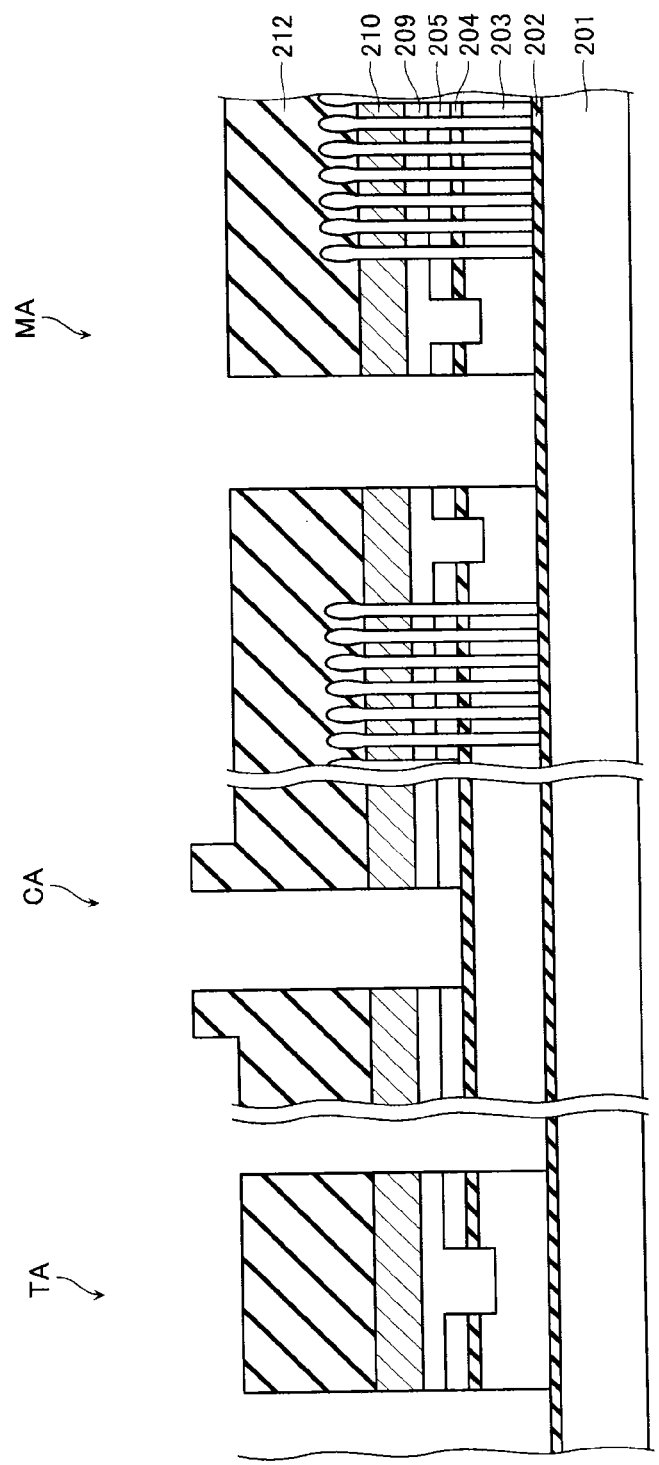
FIG. 16 is a cross-sectional view showing a manufacturing process of the same nonvolatile semiconductor memory device.
Figure 17:
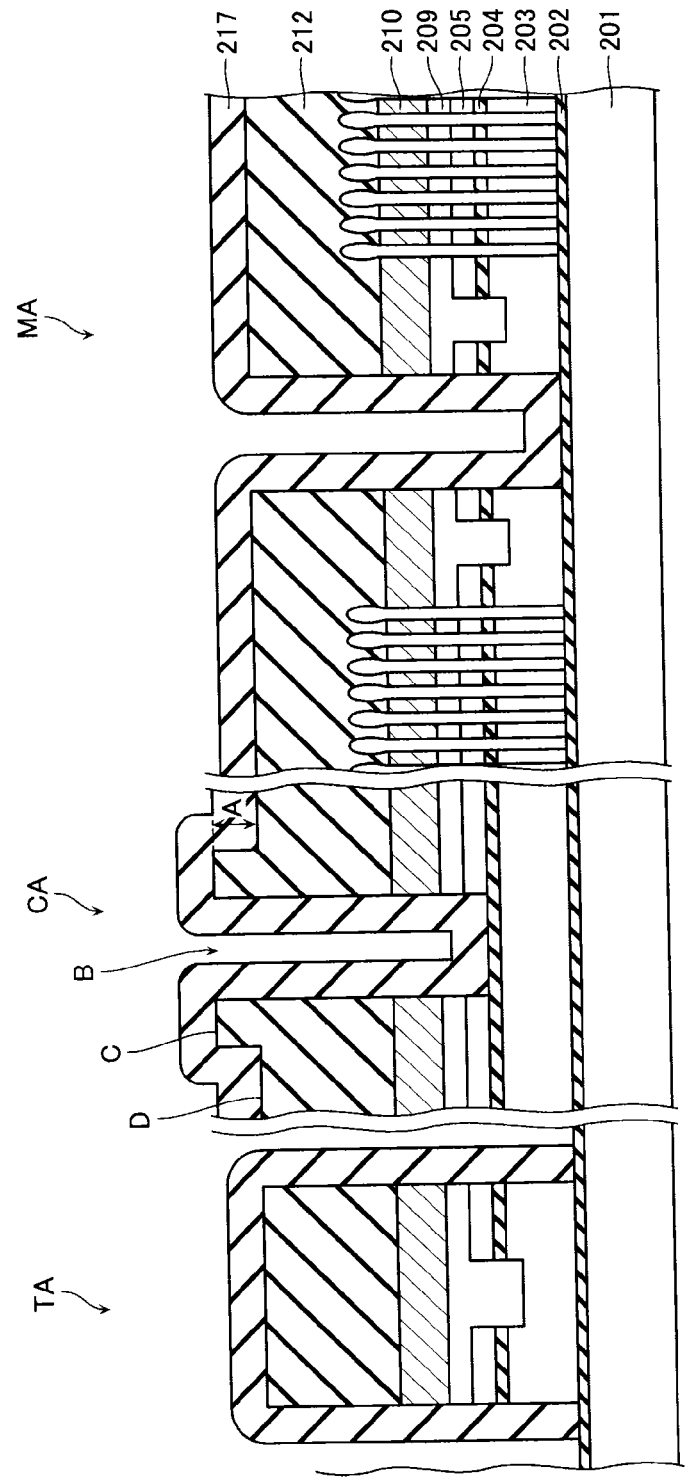
FIG. 17 is a cross-sectional view showing a manufacturing process of the same nonvolatile semiconductor memory device.

Next, as shown in FIG. 16, the resist 216 is removed, and as shown in FIG. 17, the spacer insulating layer 217 is formed. At this time, the spacer insulating layer 217 is formed along the electrode-dividing trench B and covers an upper surface of the second insulating layer 204, side surfaces of the polysilicon layer 205, the polysilicon layer 209, the metallic layer 210, and the hard mask 212, and the upper surface of the hard mask 212, in the capacitor area CA. Moreover, at the upper surface of the hard mask 212, the spacer insulating layer 217 has a level difference in accordance with the upper level portion C and the lower level portion D.

Then, by forming the likes of the insulating layer 218, the drain contact CB and source contact LI shown in FIG. 3, and so on, the nonvolatile semiconductor memory device of the kind shown in FIG. 3 is manufactured.

[Method of Manufacturing According to Comparative Example]

Next, in order to explain advantages of the method of manufacturing according to the present embodiment, a method of manufacturing according to a comparative example will be described with reference to FIGS. 18 to 23. FIGS. 18 to 23 are cross-sectional views showing the method of manufacturing according to the comparative example.

The method of manufacturing according to the comparative example is performed similarly to the method of manufacturing according to the first embodiment up to the process described with reference to FIG. 11.

Figure 18:
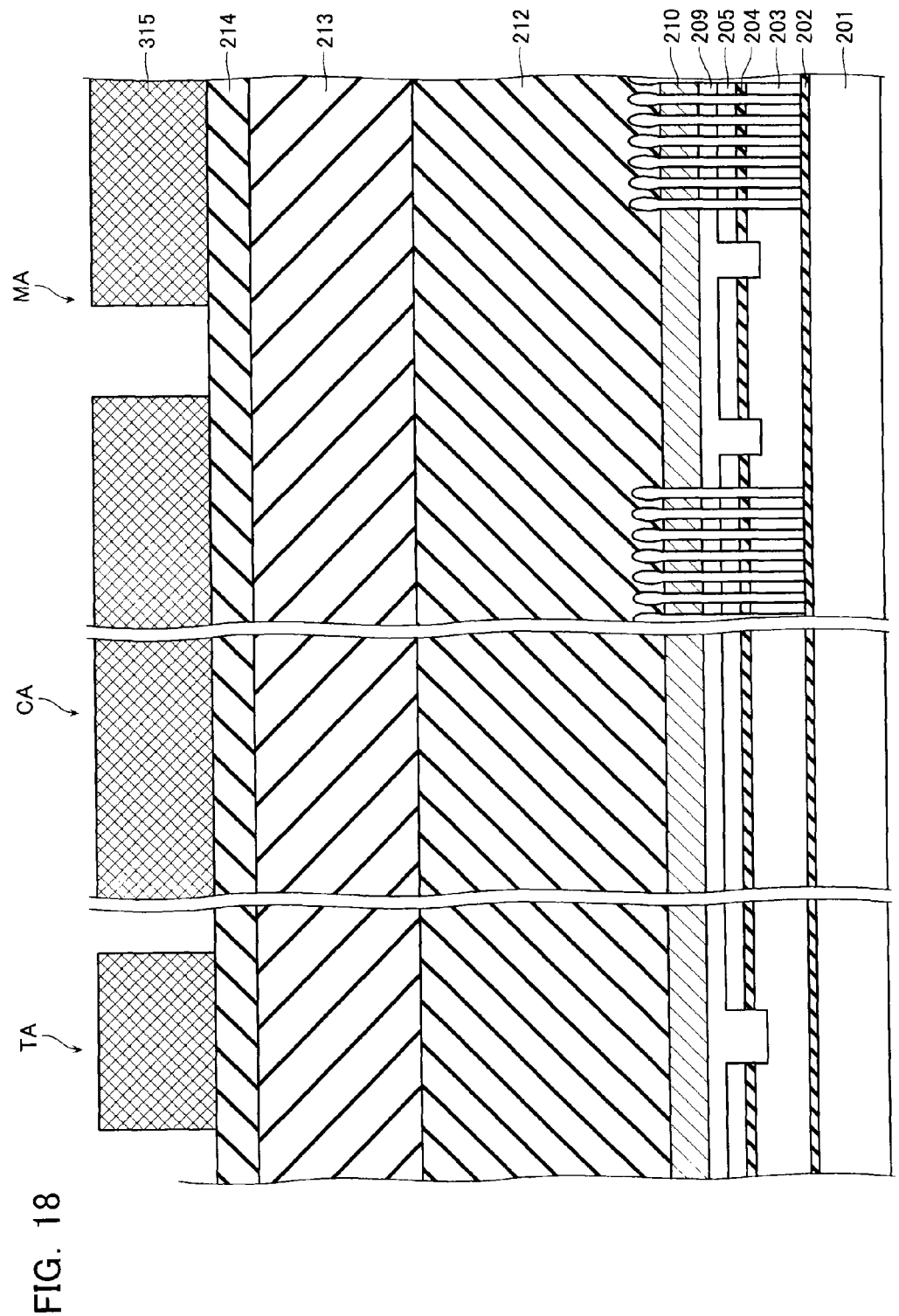
FIG. 18 is a cross-sectional view showing a manufacturing process of a nonvolatile semiconductor memory device according to a comparative example.

Following this, as shown in FIG. 18, the lower layer film resist 213, the SOG layer 214, and a resist 315 are stacked on the hard mask 212. Following this, lithography is performed, and the resist 315 in the position dividing between the NAND cell units NU of the memory area MA and the position dividing the control transistor from another layer of the transistor area TA, is removed.

Figure 19:
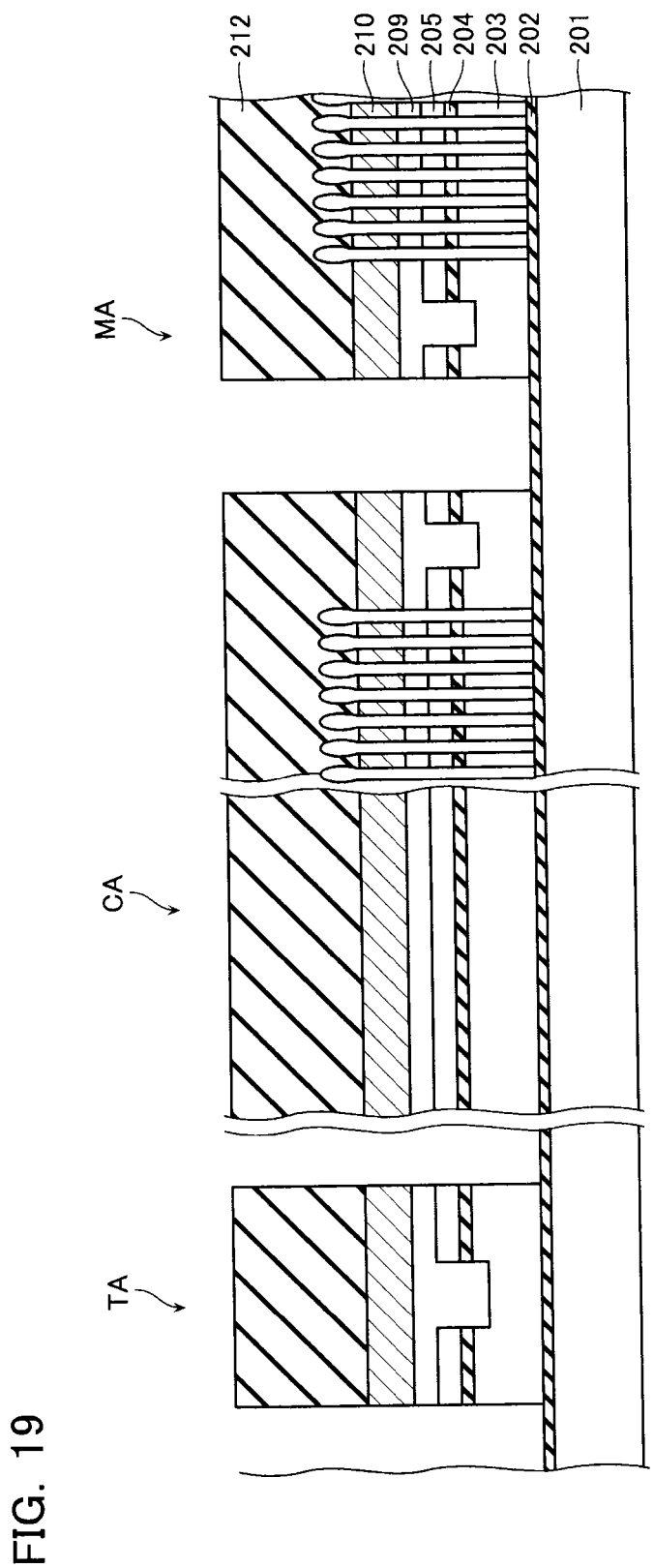
FIG. 19 is a cross-sectional view showing a manufacturing process of the same nonvolatile semiconductor memory device.

Next, as shown in FIG. 19, etching is performed using the resist 315 as a mask, and the polysilicon layer 203, the second insulating layer 204, the polysilicon layer 205, the polysilicon layer 209, the metallic layer 210, and the hard mask 212 in the position dividing between the NAND cell units NU of the memory area MA and the position dividing the control transistor from another layer of the transistor area TA, are removed. Following this, the lower layer film resist 213, the SOG layer 214, and the resist 315 are removed.

Figure 20:
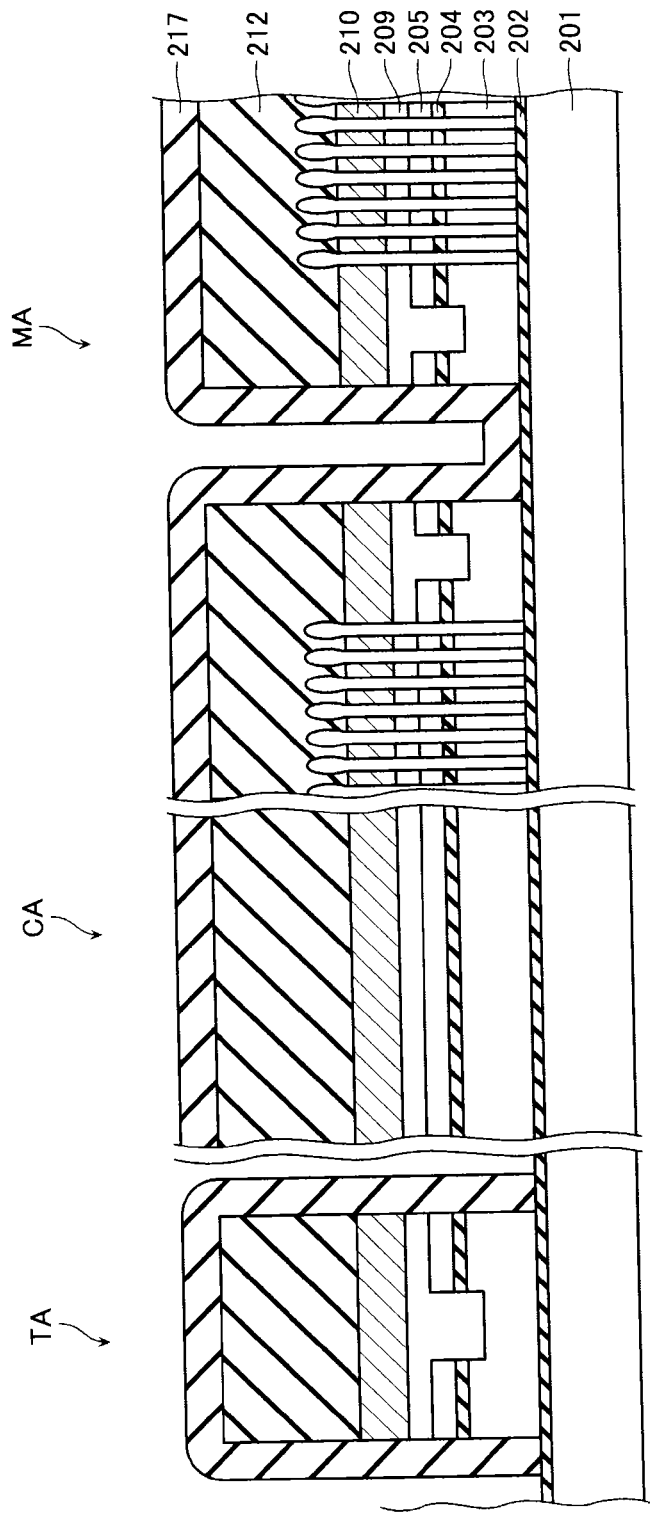
FIG. 20 is a cross-sectional view showing a manufacturing process of the same nonvolatile semiconductor memory device.
Figure 21:
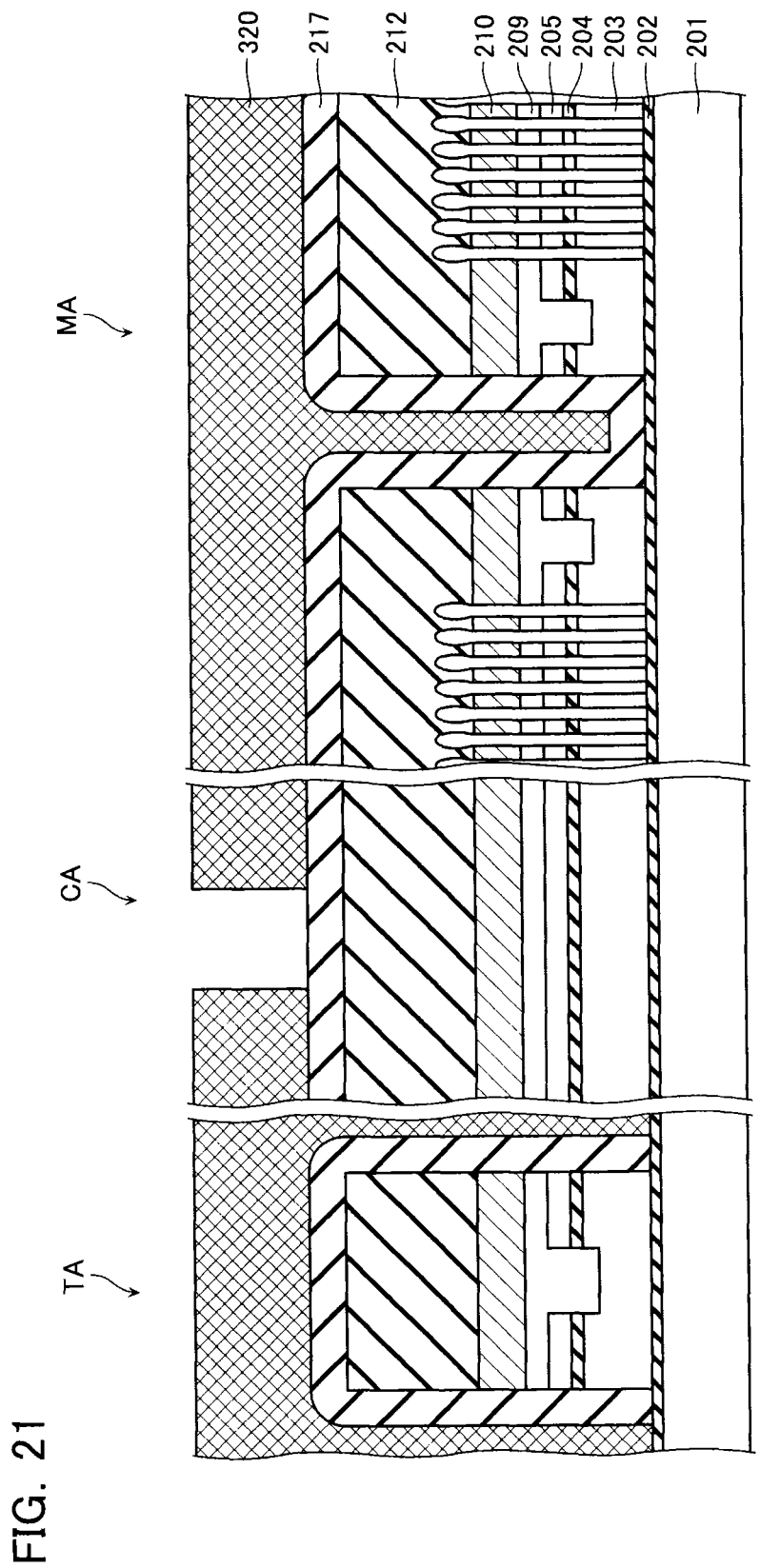
FIG. 21 is a cross-sectional view showing a manufacturing process of the same nonvolatile semiconductor memory device.

Next, as shown in FIG. 20, the spacer insulating layer 217 is formed. Next, as shown in FIG. 21, a resist 320 is formed. Following this, lithography is performed, and the resist 320 in the position dividing the second electrode layer 176 from the third electrode layer 184 of the capacitor area CA is removed.

Figure 22:
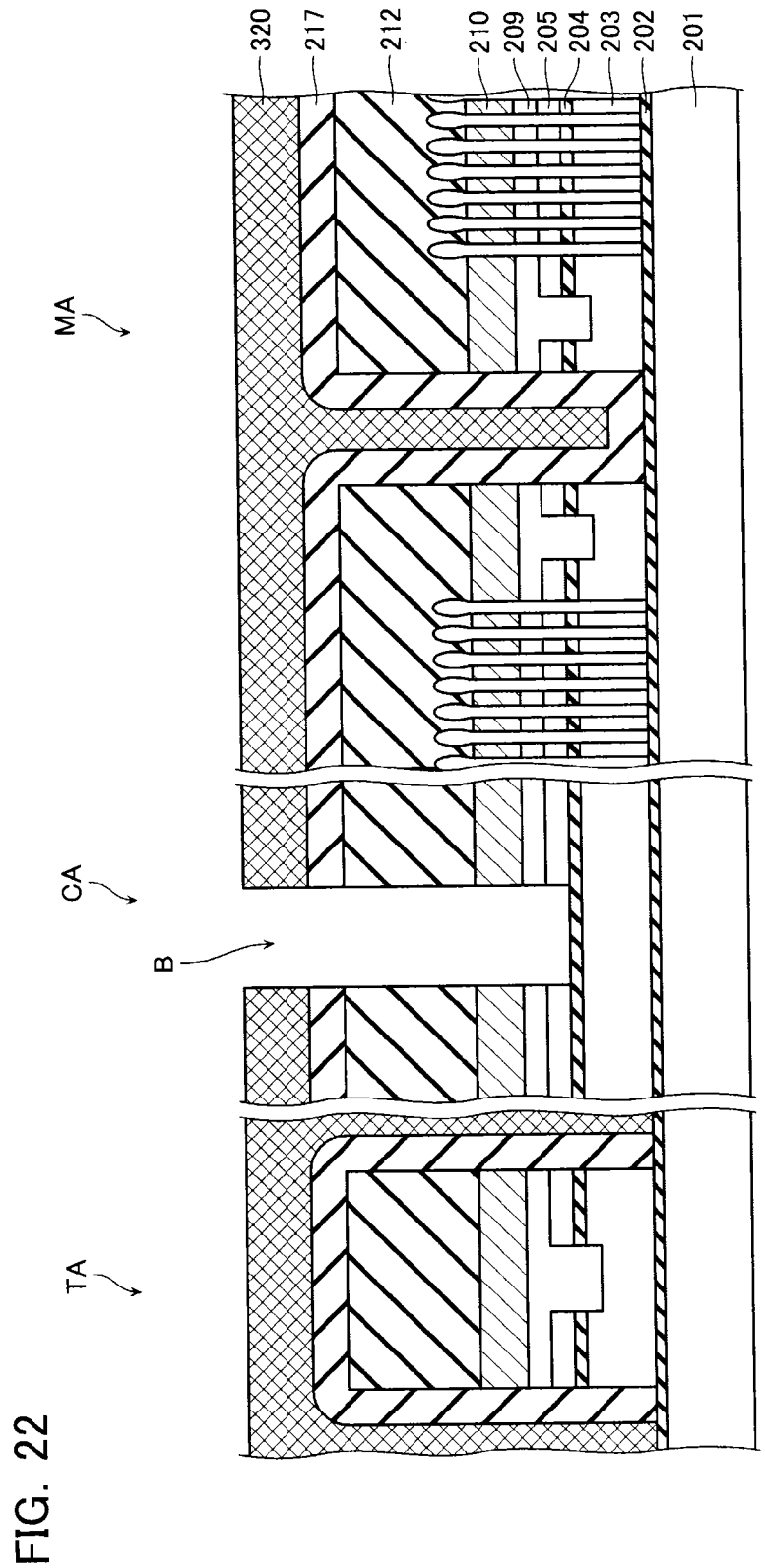
FIG. 22 is a cross-sectional view showing a manufacturing process of the same nonvolatile semiconductor memory device.
Figure 23:
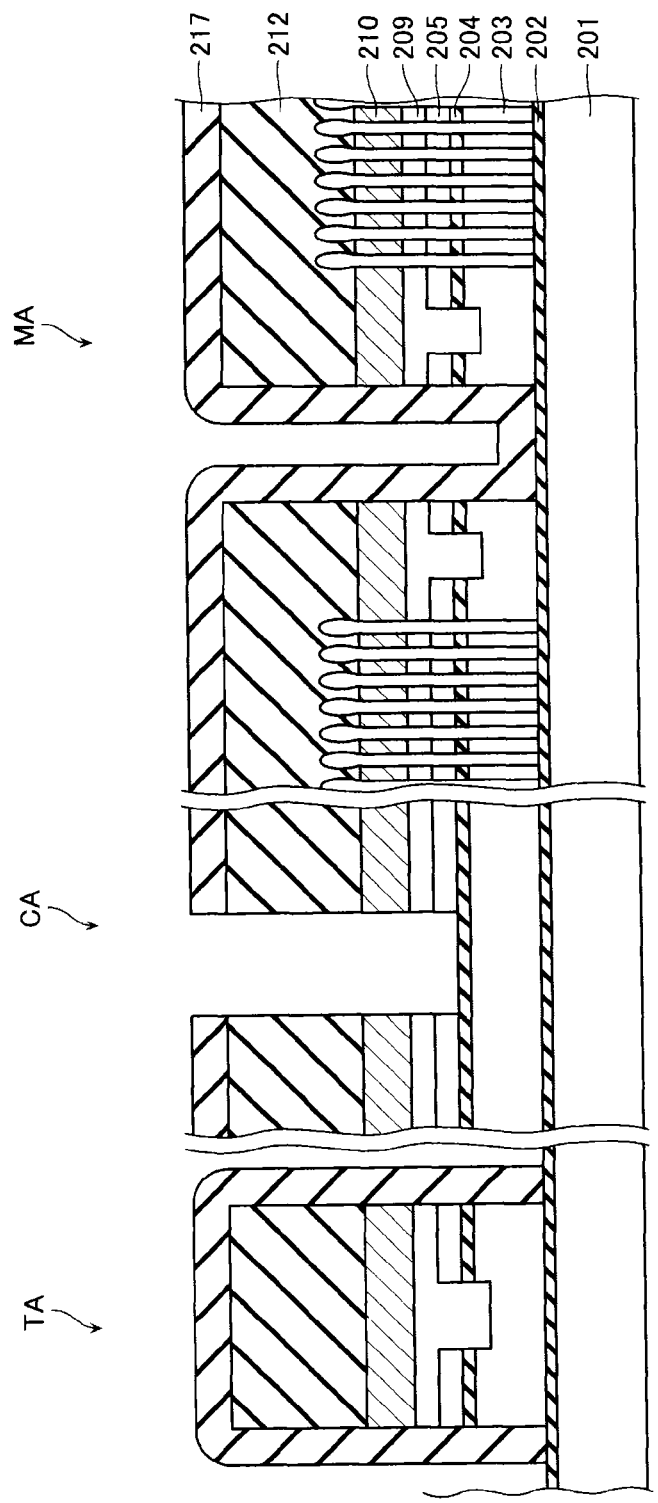
FIG. 23 is a cross-sectional view showing a manufacturing process of the same nonvolatile semiconductor memory device.

Next, as shown in FIG. 22, etching is performed using the resist 320 as a mask, and the polysilicon layer 205, the polysilicon layer 209, the metallic layer 210, the hard mask 212, and the spacer insulating layer 217 in the position dividing the second electrode layer 176 from another layer of the capacitor area CA, are removed to form the electrode-dividing trench B. Next, as shown in FIG. 23, the resist 320 is removed.

Then, by forming the likes of the insulating layer 218, the drain contact and source contact, and so on, the nonvolatile semiconductor memory device according to the comparative example is manufactured.

[Comparison of Methods of Manufacturing According to Present Embodiment and Comparative Example]

In the method of manufacturing according to the comparative example, two etching processes having different timings (layers) of stopping the etching, are separately performed. That is, in the method of manufacturing according to the comparative example, in the dividing process described with reference to FIGS. 18 and 19, layers from the hard mask 212 to the polysilicon layer 203 positioned in the memory area MA and the transistor area TA are removed. Moreover, in the method of manufacturing according to the comparative example, in the dividing process described with reference to FIGS. 21 and 22, layers from the spacer insulating layer 217 to the polysilicon layer 205 positioned in the capacitor area CA are removed. Therefore, in these dividing processes, a process removing layers from the hard mask 212 to the polysilicon layer 205 is duplicated.

In contrast, in the method of manufacturing according to the present embodiment, the two etching processes having different timings (layers) of stopping the etching, have a sharable portion commonly performed. That is, in the method of manufacturing according to the present embodiment, in the dividing process described with reference to FIGS. 12 and 13, layers from the hard mask 212 to the polysilicon layer 205 positioned in the memory area MA, the capacitor area CA, and the transistor area TA are removed. Moreover, in the method of manufacturing according to the present embodiment, in the dividing process described with reference to FIGS. 14 and 15, the polysilicon layer 203 and the second insulating layer 204 positioned in the memory area MA and the transistor area TA are removed. That is, in the method of manufacturing according to the present embodiment, by performing division for the memory area MA, the capacitor area CA, and the transistor area TA by a first time of the dividing process, duplicated division of layers in a second time of the dividing process is omitted. As a result, the method of manufacturing according to the present embodiment has manufacturing costs reduced more compared to the method of manufacturing according to the comparative example.

Second Embodiment

[Stacked Structure]

Figure 24:
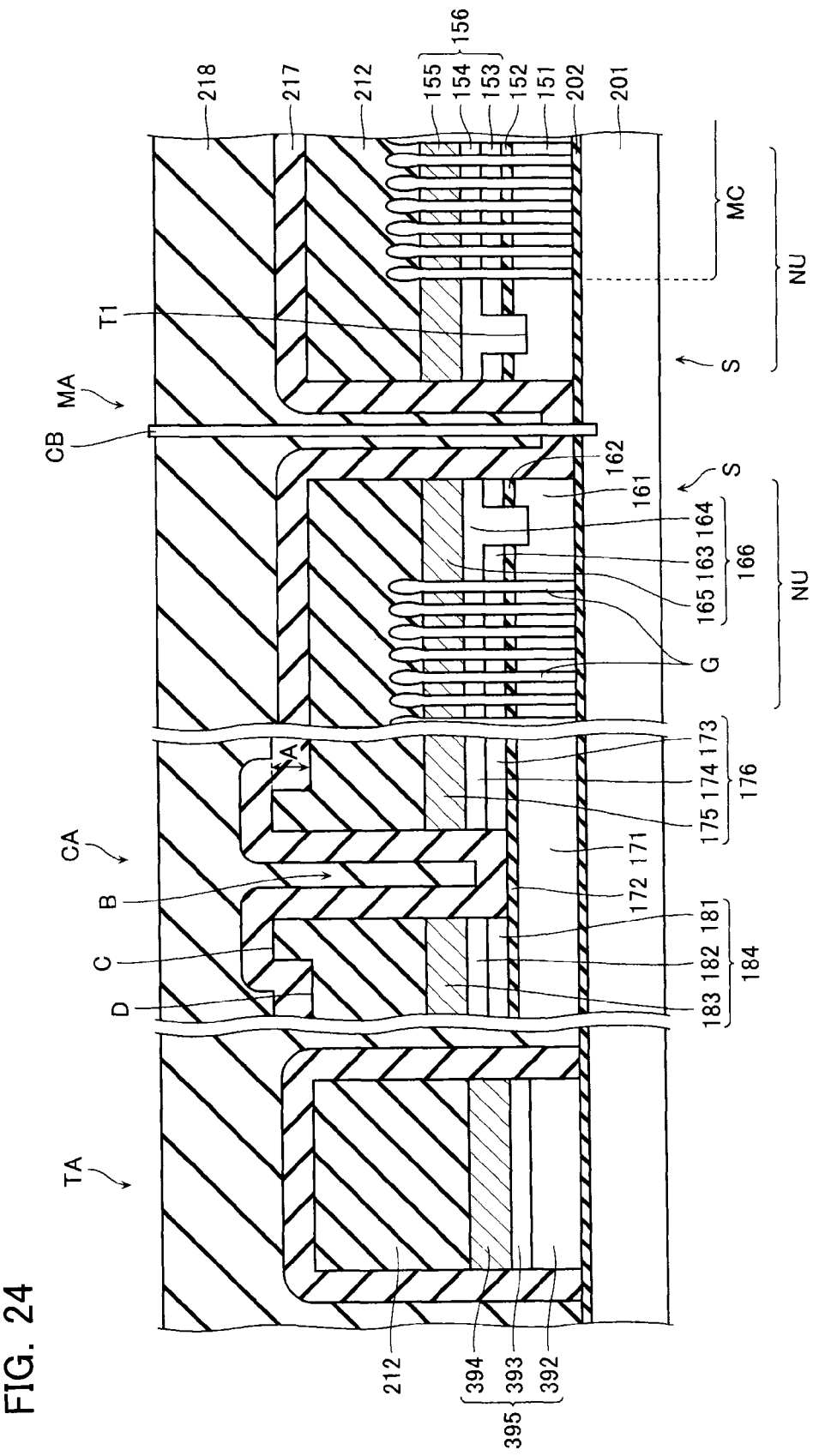
FIG. 24 is a schematic cross-sectional view showing a configuration of part of a nonvolatile semiconductor memory device according to a second embodiment.

Next, a nonvolatile semiconductor memory device according to a second embodiment will be described with reference to FIG. 24. FIG. 24 is a schematic cross-sectional view showing a stacked structure of part of the nonvolatile semiconductor memory device according to the second embodiment. Note that in FIG. 24, illustration of the source contact (FIG. 3) is omitted.

The nonvolatile semiconductor memory device according to the present embodiment is basically configured similarly to the nonvolatile semiconductor memory device according to the first embodiment, but part of a configuration of the control transistor formed in the transistor area TA is different.

That is, a control gate layer 395 of the control transistor according to the present embodiment includes, stacked sequentially therein: a ninth control gate semiconductor layer 392; a tenth control gate semiconductor layer 393 contacting an upper surface of this ninth control gate semiconductor layer 392 over an entire surface thereof; and a control gate metallic layer 394 stacked on the tenth control gate semiconductor layer 393. Moreover, the ninth control gate semiconductor layer 392 and the tenth control gate semiconductor layer 393 are implanted with the same kind of impurity. Note that the control gate layer 395 of the control transistor according to the present embodiment does not include the trench T2. Additionally, a height of the upper surface of the hard mask 212 formed on the control gate layer 395 of the control transistor according to this embodiment may be different form a height of the lower level portion D of the level difference A.

Now, sometimes, for example, the polysilicon layer 203 shown in FIG. 6 is implanted with different kinds of impurities in the memory area MA and another area (including the capacitor area CA and the transistor area TA, referred to below as a peripheral area). In this case, for example, the polysilicon layer 209 shown in FIG. 8 is implanted with the same kind of impurity as the polysilicon layer 203 in the memory area MA. Therefore, sometimes, when manufacturing the nonvolatile semiconductor memory device in this state, a PN junction got formed between the first control gate semiconductor layer 191 and the second control gate semiconductor layer 193 shown in FIG. 3, and an interface resistance at these layers increased, leading to deterioration of performance of the control transistor.

Now, the control gate layer 395 of the control transistor according to the present embodiment includes, stacked therein, the ninth control gate semiconductor layer 392 and tenth control gate semiconductor layer 393 implanted with the same kind of impurity, and the control gate metallic layer 394. Therefore, it is possible to lower the interface resistance between layers configuring the control gate layer 395 and improve performance of the control transistor.

[Method of Manufacturing]

Next, a specific manufacturing process of a NAND type flash memory according to this embodiment will be described with reference to FIGS. 25 to 31. FIGS. 25 to 31 are cross-sectional views showing a method of manufacturing the nonvolatile semiconductor memory device according to the present embodiment.

As shown in FIGS. 25 to 31, the method of manufacturing according to the present embodiment is performed substantially similarly to the method of manufacturing according to the first embodiment, but part of the method of manufacturing the control transistor is different.

Figure 25:
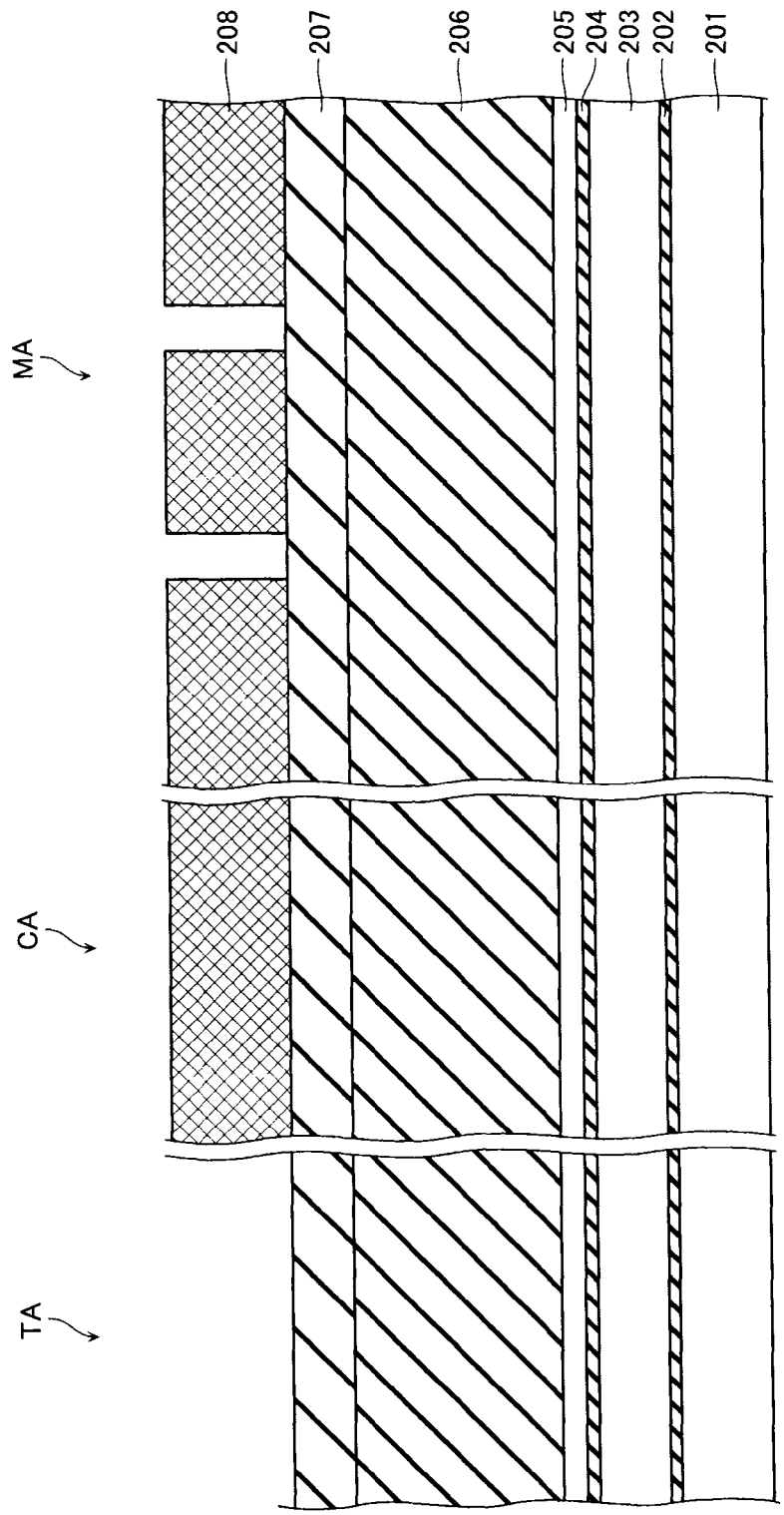
FIG. 25 is a cross-sectional view showing a manufacturing process of the same nonvolatile semiconductor memory device.
Figure 26:
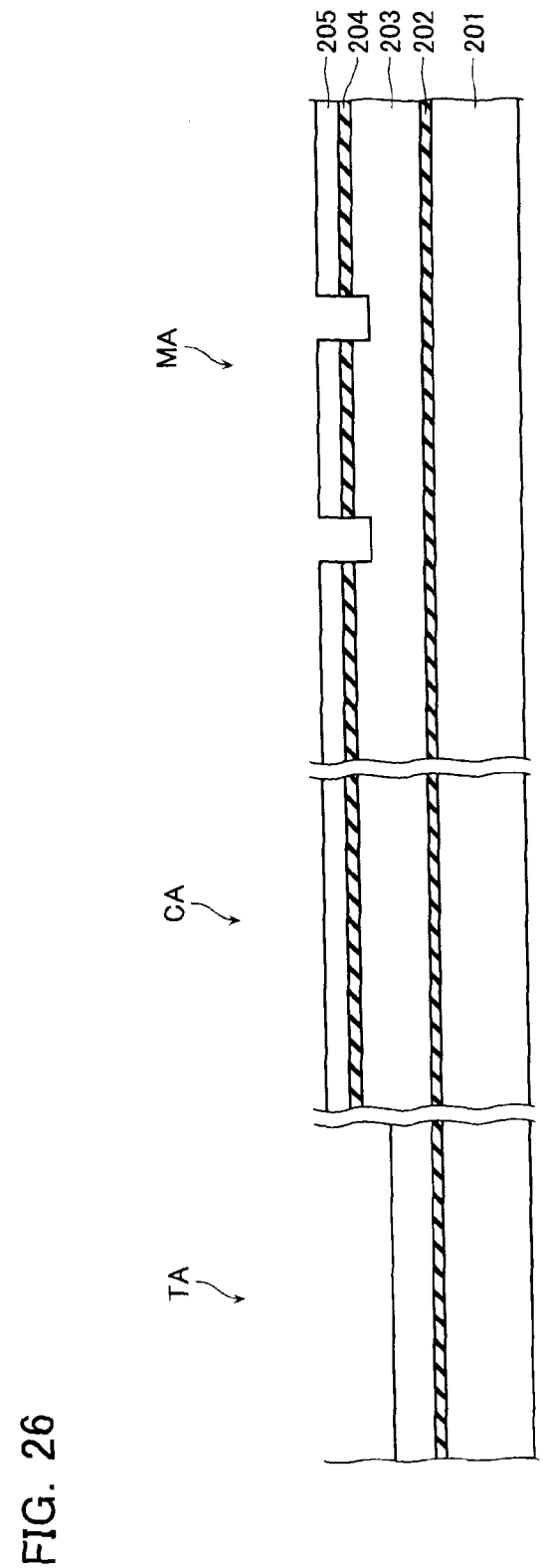
FIG. 26 is a cross-sectional view showing a manufacturing process of the same nonvolatile semiconductor memory device.

That is, as shown in FIGS. 6 and 7, in the first embodiment, only the part P2 of the resist 208 positioned in the transistor area TA was removed and the trench T2 formed. In contrast, as shown in FIGS. 25 and 26, in the present embodiment, all of the resist 208 positioned in the transistor area TA is removed to perform etching, and a part of an upper portion of the polysilicon layer 203, the second insulating layer 204, and the polysilicon layer 205 positioned in the transistor area TA is all removed. Therefore, even if, for example, the polysilicon layer 203 has been implanted with different kinds of impurities in the memory area MA and the peripheral area, an upper portion where this impurity was introduced is removed in the transistor area TA.

Figure 27:
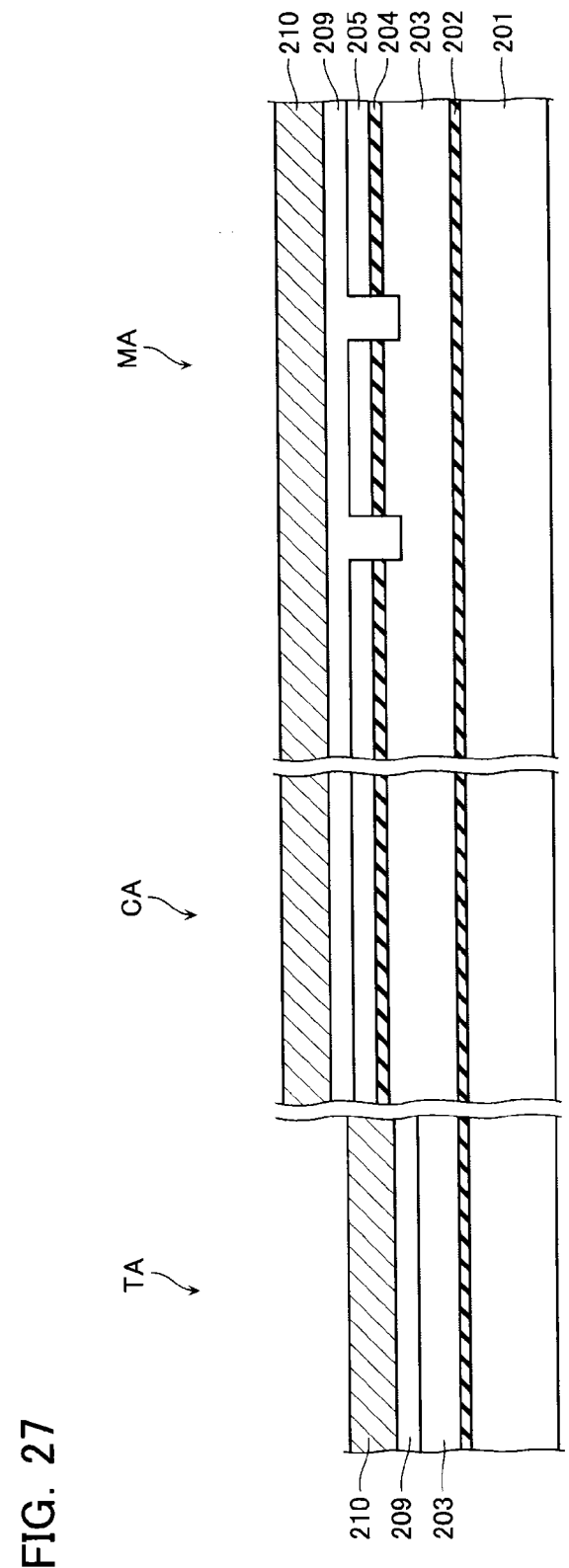
FIG. 27 is a cross-sectional view showing a manufacturing process of the same nonvolatile semiconductor memory device.

Next, as shown in FIG. 27, the polysilicon layer 209 and the metallic layer 210 are stacked. At this time, in the transistor area TA, the polysilicon layer 209 is stacked on the polysilicon layer 203 whose upper portion was removed in the process shown in FIG. 7. Moreover, the polysilicon layer 209 is selectively implanted by lithography with the same kind of impurity as the polysilicon layer 203 in the transistor area TA.

Figure 28:
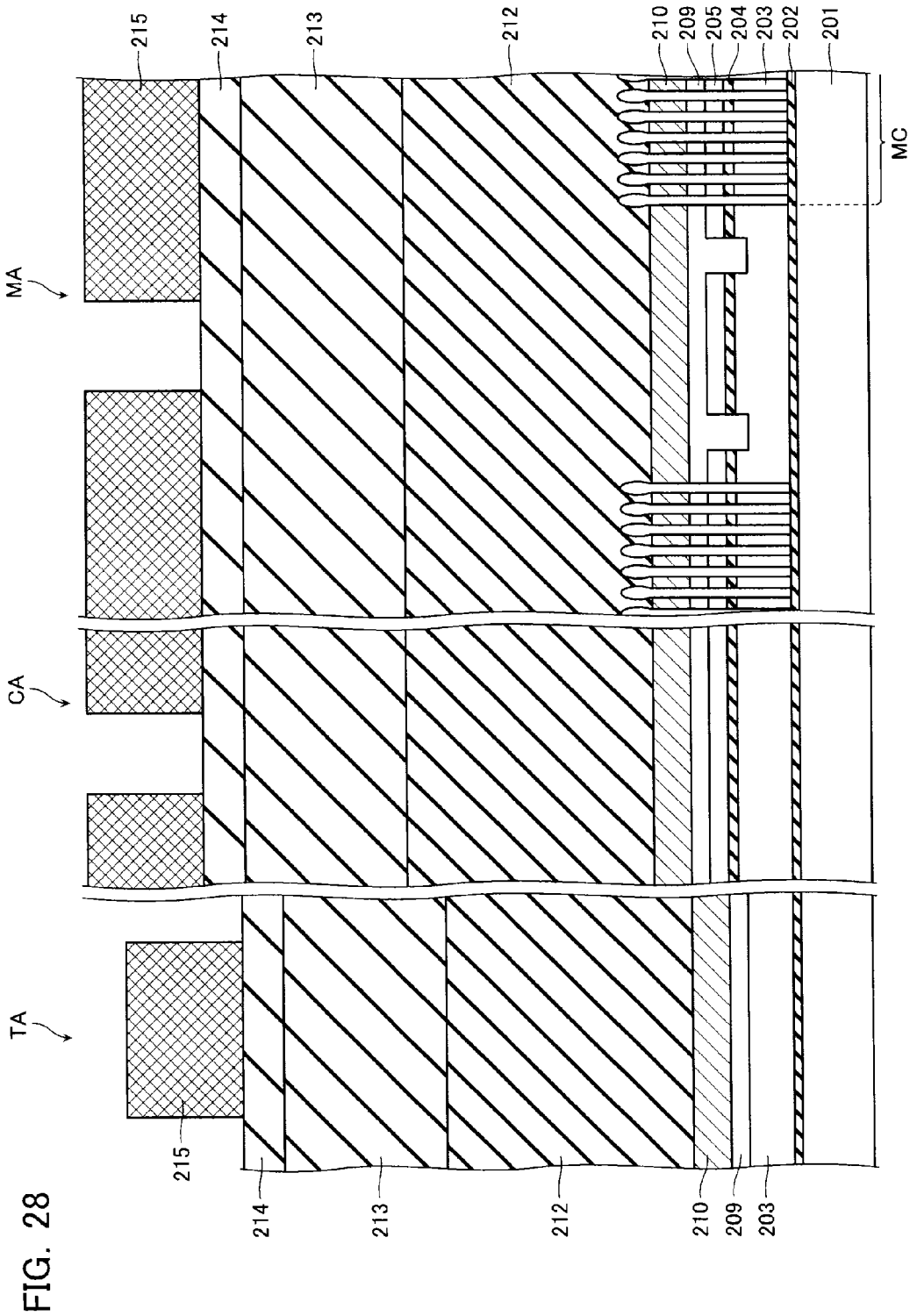
FIG. 28 is a cross-sectional view showing a manufacturing process of the same nonvolatile semiconductor memory device.
Figure 29:
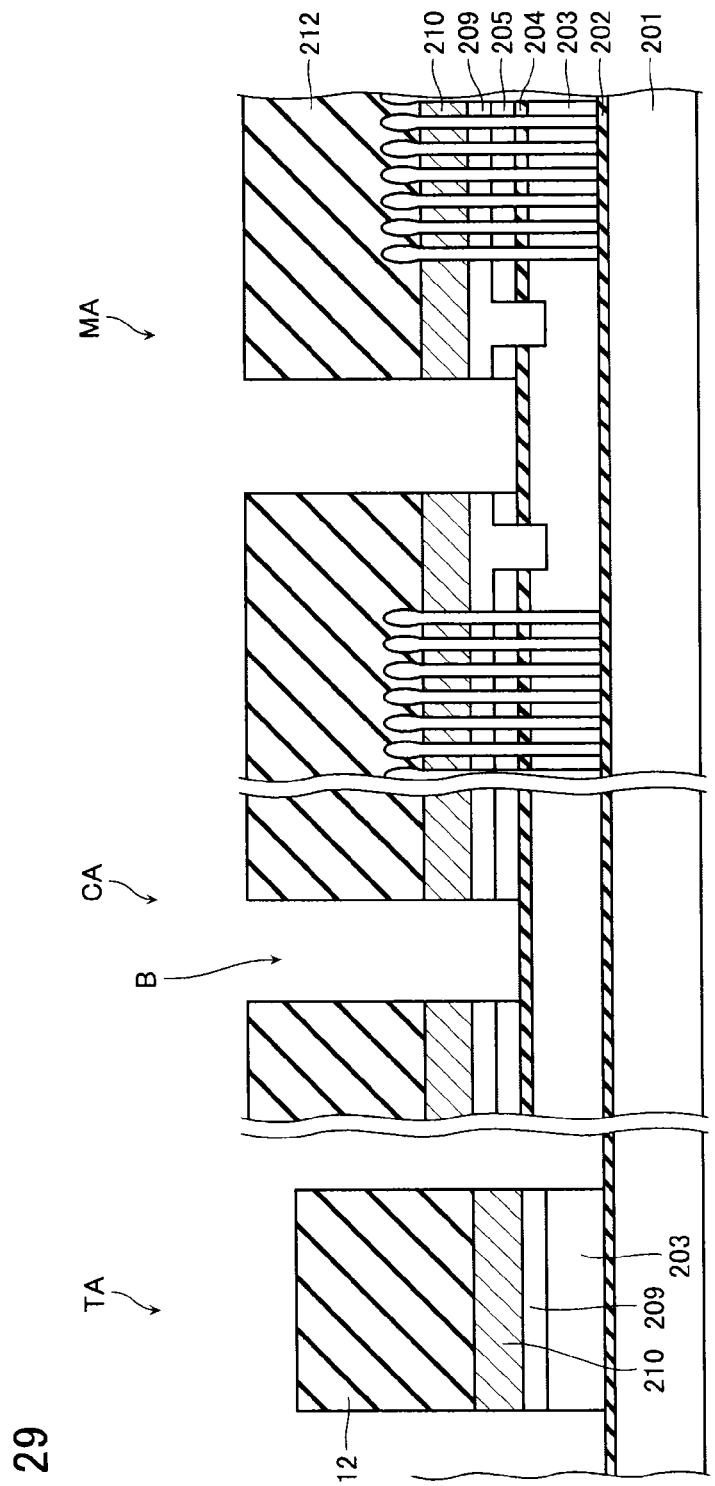
FIG. 29 is a cross-sectional view showing a manufacturing process of the same nonvolatile semiconductor memory device.

Next, as shown in FIG. 28, the memory cell MC is formed by a substantially similar process to the process shown in FIGS. 9 to 11. Next, as shown in FIGS. 28 and 29, etching is performed by a similar process to the process described with reference to FIGS. 12 and 13. As a result, as shown in FIG. 29, the capacitor and the control transistor according to the present embodiment are formed.

Figure 30:
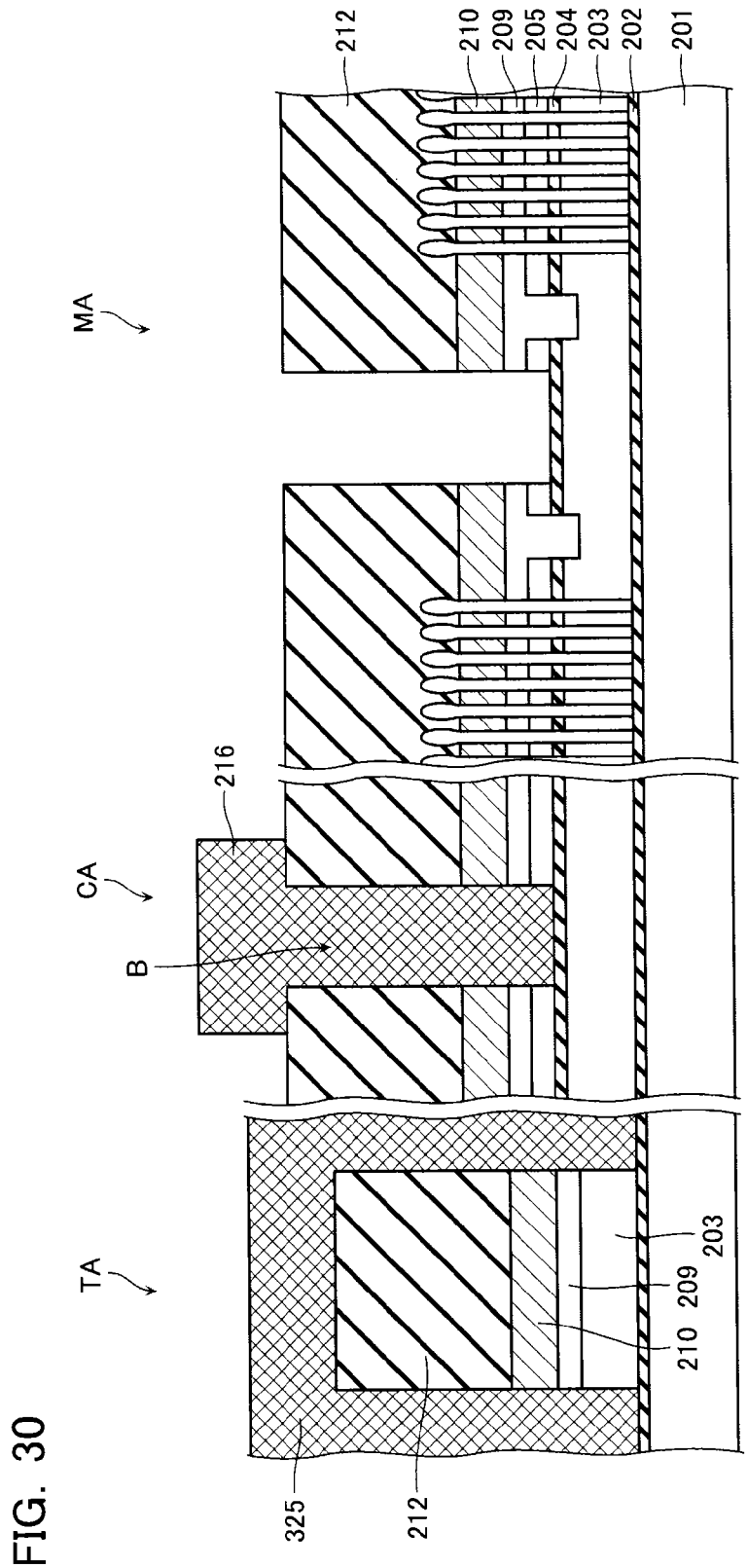
FIG. 30 is a cross-sectional view showing a manufacturing process of the same nonvolatile semiconductor memory device.

Next, as shown in FIG. 30, the electrode-dividing trench B and the periphery of the electrode-dividing trench B are covered by the resist 216, and at the same time, an entire area of the transistor area TA is covered by a resist 325. That is, not only the polysilicon layer 203 and the second insulating layer 204 in the capacitor area CA are protected, but also the control transistor is protected.

Figure 31:
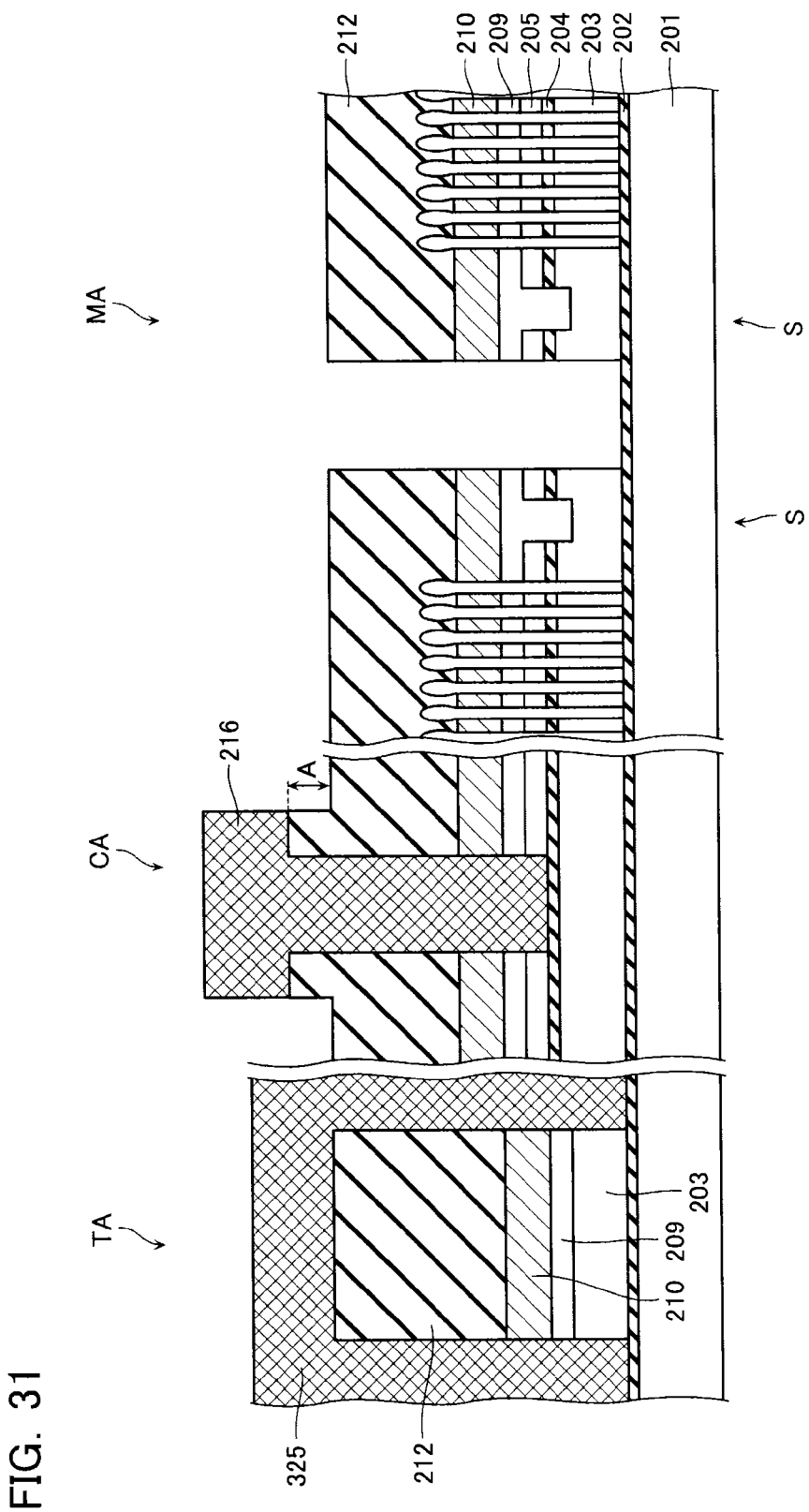
FIG. 31 is a cross-sectional view showing a manufacturing process of the same nonvolatile semiconductor memory device.

Next, as shown in FIG. 31, etching is performed using the resist 216 and the resist 325 as a mask, and the polysilicon layer 203 and the second insulating layer 204 in the position dividing between the NAND cell units NU of the memory area MA are removed. In this process, the select gate transistor S is formed. Moreover, in this process, the upper level portion C is formed at a portion of the hard mask 212 upper surface where the resist 216 is positioned and the lower level portion D is formed at a portion of the hard mask 212 upper surface where the resist 216 is not positioned, similarly to in the first embodiment.

Then, by removing the resist 216 and the resist 325 and forming the likes of the spacer insulating layer 217, the insulating layer 218, the drain contact and source contact, and so on, the nonvolatile semiconductor memory device of the kind shown in FIG. 24 is manufactured.

Compared to the method of manufacturing according to the first embodiment, the method of manufacturing according to the second embodiment is achievable simply by changing a pattern of lithography in the process shown in FIG. 25 and a pattern of lithography in the process shown in FIG. 30. Therefore, the method of manufacturing according to the second embodiment can be achieved at a similar manufacturing cost to the method of manufacturing according to the first embodiment.

Moreover, as mentioned above, sometimes, the polysilicon layer 203 is implanted with different kinds of impurities in the memory area MA and the peripheral area. In this case, an impurity concentration of the polysilicon layer 203 overall was optimized for memory area MA use, after which, in a peripheral area portion, an impurity was implanted for canceling out a former dopant concentration, and a desired impurity was further introduced. In this case, it was required to implant the impurity at high concentration in the peripheral area portion. Moreover, sometimes, a PN junction got formed between the first control gate semiconductor layer 191 and the second control gate semiconductor layer 193, and an interface resistance at these layers increased, leading to deterioration of performance of the control transistor.

Now, as shown in FIG. 26, in the present embodiment, even if, for example, the polysilicon layer 203 has been implanted with different kinds of impurities in the memory area MA and the peripheral area, an upper portion where this impurity was introduced is removed in the transistor area TA. Therefore, in the transistor area TA, there is no need to implant an impurity of high concentration to cancel out the former dopant concentration. Moreover, in the transistor area TA, impurities of the polysilicon layer 203 and the polysilicon layer 209 can be matched. As a result, it is possible to lower the interface resistance between layers configuring the control gate layer 395 and improve performance of the control transistor.

Other Embodiments

In the above-described first and second embodiments, the process for forming the memory cell MC such as described with reference to, for example, FIGS. 9 and 10, and the process for forming the select gate transistor S and the control transistor such as described with reference to, for example, FIGS. 12 to 15, were separately performed. This is because if, for example, these processes are performed simultaneously, then in terms of lithography characteristics, sometimes, the first space from the select gate transistor S where a cycle of L/S is disturbed (FIG. 3) ends up enlarging relatively with respect to a space between the memory cells MC and substrate digging at this space ends up deteriorating. However, it is also possible for these processes to be performed simultaneously.

Moreover, in the process shown in FIG. 14 in the above-described first embodiment, and in the process shown in FIG. 30 in the above-described second embodiment, only the electrode-dividing trench B and its periphery of the capacitor area CA were covered by the resist 216. However, for example, an entire area of the capacitor area CA may be covered by the resist 216. In this case, as a result, the upper level portion of level difference A formed in the hard mask 212 is formed over the entire area of the capacitor area CA, and the lower level portion is formed outside of the capacitor area CA.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device, the nonvolatile semiconductor memory device comprising: a memory area including a plurality of memory cells each comprising a charge accumulation layer, and a select gate transistor; a capacitor area including a capacitor; and a transistor area including a control transistor, on a semiconductor substrate, the method comprising:
    depositing a first insulating layer, a first conductive layer, and a second insulating layer on the semiconductor substrate;
    removing at least part of the second insulating layer in a portion of the memory area where the select gate transistor is formed and in the transistor area;
    depositing a second conductive layer on the semiconductor substrate;
    dividing the first conductive layer and the second conductive layer to form the plurality of memory cells;
    removing the second conductive layer at a certain position of the memory area, the capacitor area and the transistor area, and forming a first trench that divides the second conductive layer in the capacitor area, to form the capacitor;
    selectively removing the second insulating layer and the first conductive layer at least at a position where the adjacently formed select gate transistors are divided, to form the select gate transistor.

2. The method of manufacturing a nonvolatile semiconductor memory device according to claim 1, further comprising
    after forming the capacitor and before forming the select gate transistor, forming a mask protecting the first trench, in the capacitor area.

3. The method of manufacturing a nonvolatile semiconductor memory device according to claim 1, further comprising
    after forming the plurality of memory cells, depositing a hard mask covering at least part of the capacitor area.

4. The method of manufacturing a nonvolatile semiconductor memory device according to claim 1, further comprising
    implanting a spacer insulating layer in the electrode-dividing trench.

5. The method of manufacturing a nonvolatile semiconductor memory device according to claim 1, further comprising
    when forming the select gate transistor, removing the second insulating layer and the first conductive layer at a position of the transistor area where the control transistor is divided from another layer, to form the control transistor.

6. The method of manufacturing a nonvolatile semiconductor memory device according to claim 1, further comprising:
    when depositing the first insulating layer, the first conductive layer, and the second insulating layer on the semiconductor substrate, further depositing a third conductive layer on the second insulating layer;
    when removing at least part of the second insulating layer in a portion of the memory area where the select gate transistor is formed and in the transistor area, removing part of the second insulating layer and the third conductive layer using a mask in the memory area and without using a mask in the transistor area; and
    when forming the capacitor, forming the control transistor.

* * * * *